United States Patent [19]

Ogashiwa

[11] Patent Number: 5,366,692
[45] Date of Patent: Nov. 22, 1994

[54] ALLOY CONNECTING MATERIALS FOR SEMICONDUCTORS

[75] Inventor: Toshinori Ogashiwa, Tokyo, Japan

[73] Assignee: Tanaka Denshi Kogyo Kabushiki Kaisha, Tokyo, Japan

[21] Appl. No.: 618,900

[22] Filed: Nov. 28, 1990

[30] Foreign Application Priority Data

Dec. 27, 1989 [JP] Japan .................. 1-340132
Jun. 29, 1990 [JP] Japan .................. 2-171991
Aug. 24, 1990 [JP] Japan .................. 2-222729

[51] Int. Cl.$^5$ .................. C22C 13/00; C22C 11/00
[52] U.S. Cl. .................. 420/565; 148/400; 420/562; 420/570; 420/571; 428/645; 437/180
[58] Field of Search .......... 420/565, 558, 570, 562, 420/571; 428/645, 646; 437/180, 183; 148/400

[56] References Cited

U.S. PATENT DOCUMENTS

| | | | |
|---|---|---|---|
| 2,298,237 | 10/1942 | Smith, Jr. et al. | 420/571 |
| 3,644,115 | 2/1972 | Hamaguchi | 420/558 |
| 3,744,121 | 7/1973 | Nagano et al. | 420/571 |
| 4,106,930 | 8/1978 | Nomaki et al. | 420/571 |
| 4,323,393 | 4/1982 | Nagahori et al. | 420/571 |
| 4,588,657 | 5/1986 | Kujas | 420/558 |
| 4,622,205 | 11/1986 | Fouts et al. | 420/570 |
| 4,654,275 | 3/1987 | Bose et al. | 420/570 |
| 4,670,217 | 6/1987 | Henson et al. | 420/562 |
| 4,734,256 | 3/1988 | Liebermann et al. | 420/570 |
| 4,876,221 | 10/1989 | Hataka | 437/183 |
| 4,950,623 | 8/1990 | Dishon | 437/183 |
| 5,011,658 | 4/1991 | Niedrich | 420/570 |
| 5,066,614 | 11/1991 | Dunaway et al. | 437/217 |
| 5,071,787 | 12/1991 | Mori et al. | 437/183 |

FOREIGN PATENT DOCUMENTS

| | | |
|---|---|---|
| 0264648 | 4/1988 | European Pat. Off. . |
| 0288776 | 11/1988 | European Pat. Off. . |
| 0326018 | 8/1989 | European Pat. Off. . |
| 63-301535 | 12/1988 | Japan . |
| 2201545 | 9/1988 | United Kingdom . |

OTHER PUBLICATIONS

English translation of claim 1 of Japanese patent 63-301535.

*Primary Examiner*—Upendra Roy
*Attorney, Agent, or Firm*—Sandler, Greenblum & Bernstein

[57] ABSTRACT

A method of electrically connecting a semiconductor package to a substrate by using bump contacts formed by heating the tip of an alloy wire and directly joined to aluminum alloy wiring lines, an alloy wire for such a purpose, and a semiconductor device constructed by electrically connecting a semiconductor package to a substrate by such a method. The alloy wire is produced by drawing an alloy material produced by quench solidifying an alloy containing Pb, Sn or In as a principal element, and an additive element or additives elements. The tip of the alloy wire is heated to form a ball to be joined to the aluminum alloy wiring line as a bump contact. The Brinell hardness number of the ball is $H_B$ 6 or higher.

6 Claims, 2 Drawing Sheets

5,366,692

ALLOY CONNECTING MATERIALS FOR SEMICONDUCTORS

BACKGROUND OF THE INVENTION

1. Field of the Invention

The present invention relates to a semiconductor package connecting method and, more specifically, to a method of connecting a semiconductor package, such as a semiconductor chip, to a substrate by a wireless bonding process, particularly, a flip chip bonding process or a tape carrier bonding process, connecting wires for such a purpose, and semiconductor devices fabricated by a process employing such a connecting method.

2. Description of the Prior Art

A semiconductor package connecting method using bumps formed by a wire bonder and connecting materials for such a semiconductor package connecting method are disclosed in Japanese Patent Laid-open No. 63-301535. This known semiconductor package connecting method uses a fine alloy wire produced by quench solidifying an alloy containing Pb Sn or In as a principal element. The tip of the alloy wire is heated to form a ball, the ball is attached to the wiring line of a semiconductor package or a substrate, and then the alloy wire is pulled off the ball to form a bump electrode on the wiring line. The semiconductor package and the substrate are connected by means of such bump electrodes.

Recently, aluminum alloys, such as Al-Si and Al-Cu-Si, have become used widely as wiring materials for semiconductor chips for their capability of suppressing electromigration and of improving the reliability of semiconductor chips. In attaching the ball directly to the aluminum alloy wiring line of a semiconductor package of a substrate by this known semiconductor package connecting method, the aluminum alloy wiring line must be heated in a flux containing $CuCl_2$, $ZnCl_2$, $NH_4Cl$, $SnCl_2$ or HCl to remove an oxide covering the surface of the aluminum alloy wiring line, which requires an additional process and time and increases the cost of the semiconductor device.

SUMMARY OF THE INVENTION

Accordingly, it is an object of the present invention to form a bump electrode by using an alloy wire produced by quench solidification and to bond the bump electrode directly to an aluminum alloy wiring line.

In one aspect of the present invention, a semiconductor package connecting method comprises steps of forming a ball of a Brinell hardness number of 6 (hereinafter referred to as "$H_B 6$") or higher by heating the tip of a fine alloy wire produced by quench solidifying an alloy containing Pb, Sn or In as a principal element, pulling the alloy wire off the ball with the ball bonded to an aluminum alloy wiring line of a semiconductor package or a substrate to form a bump electrode on the aluminum alloy wiring line, and connecting the semiconductor package to the substrate with such bump electrodes.

In another aspect of the present invention, a semiconductor package connecting material is a fine wire produced by quench solidifying an alloy containing Pb, Sn or In as a principal element, and one or some of additive elements, and capable of forming a ball of $H_B$ of 6 or higher when its tip is heated.

Preferably, the alloy forming the fine wire contains one or some of additive elements among Be, B, C, Mg, Al, Si, P, Ca, Ti, V, Cr, Mn, Fe, Co, Ni, Cu, Zn, Ga, Ge, Se, Zr, Nb, Mo, Pd, Ag, Cd, In, Sn, Pb, Sb, Te, Ir, Pt, Au, Tl and Bi.

In a further aspect of the present invention, a semiconductor device comprises semiconductor packages electrically connected to a substrate by means of bump electrodes formed by heating the tip of a fine alloy wire produced by quench solidifying an alloy containing Pb, Sn or In as a principal element, wherein the wiring lines of the semiconductor packages or the substrate are formed of an aluminum alloy, and balls serving as the bump electrodes has a hardness of $H_B 6$ or higher.

Preferably, the alloy forming the fine wire consists of a principal element and one or some of additive elements among Be, B, C, Mg, Al, Si, P, Ca, Ti, V, Cr, Mn, Fe, Co, Ni, Cu, Zn, Ga, Ge, Se, Zr, Nb, Mo, Pd, Ag, Cd, In, Sn, Pb, Sb, Te, Ir, Pt, Au, Tl and Bi.

The ball of the alloy of a hardness of $H_B 6$ or higher disrupts an oxide film of a hardness on the order of $H_B$ 12 and covering the surface of the aluminum alloy wiring line, and the ball and the aluminum alloy wiring line are bonded metallurgically by the diffusion between the fresh ball and the fresh surface of the aluminum alloy wiring line.

BRIEF DESCRIPTION OF THE DRAWINGS

The above and other objects, features and advantages of the present invention will become more apparent from the following description taken in connection with the accompanying drawings, in which.

DESCRIPTION OF THE PREFERRED EMBODIMENTS

Figure 1:
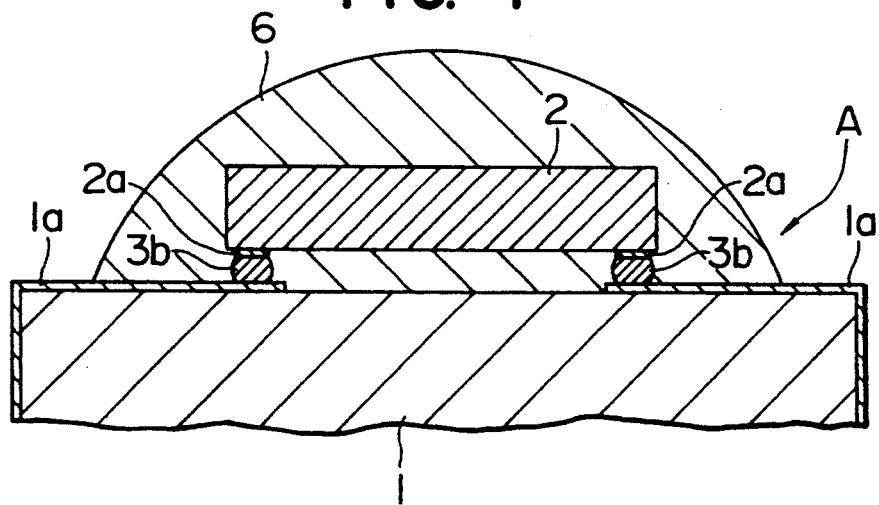
FIG. 1 is a longitudinal sectional view of a semiconductor device in a preferred embodiment according to the present invention.

Referring to FIG. 1, a semiconductor device A is of a so-called flip-chip mount type constructed by disposing a semiconductor chip (semiconductor package) 2 in the central area of the upper surface of a substrate 1, electrically connecting the aluminum alloy wiring lines 2a, i.e., wiring lines of an Al-Si alloy or an Al-Cu-Si alloy, of the semiconductor chip 2 to those of the wiring lines 1a, i.e., Cu lines plated with Sn or Au, arranged on the upper surface of the substrate 1 with bump contacts 3b, and sealing the semiconductor chip 2 and part of the wiring lines 1a of the substrate 1 with a protective resin 6, such as a silicone resin. The bump contacts 3b are formed previously by bonding balls 3a formed by heating the tip of an alloy wire 3, i.e., a connecting material, to the alloy wiring lines 2a of the semiconductor chip 2 through a procedure shown in FIGS. 2 to 5.

The alloy wire 3 is formed of an alloy consisting of Pb, Sn or In as a principal element, and additive elements and produced by a quench solidifying process. The alloy wire 3 may contain one or some additive elements among Be, B, C, Mg, Al, Si, P, Ca, Ti, V, Cr, Mn, Fe, Co, Ni, Cu, Zn, Ga, Ge, Se, Zr, Nb, Mo, Pd, Ag, Cd, Sb, Te, It, Pt, Au, Tl and Bi. An alloy not containing Pb, Sn or In as the principal element may contain Pb, Sn or In as an additive element.

When quenched, many lattice defects are formed in the alloy forming the alloy wire 3, minute crystal grains develop in an unequilibrated phase to produce a forced solid solution of the component elements. When the alloy is drawn to produce the alloy wire 3, lattice defects are formed by work hardening, and the structure of the alloy is solution-hardened by the additive elements.

Figure 2:
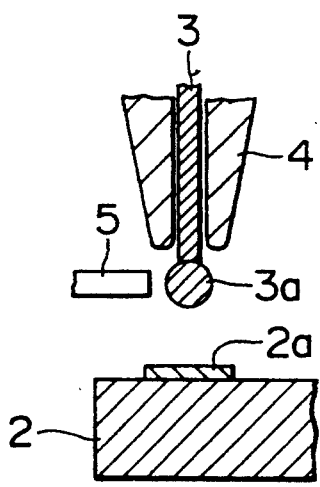
FIGS. 2 through 5 are enlarged fragmentary longitudinal views showing steps of connecting a semiconductor package to a substrate.
Figure 3:
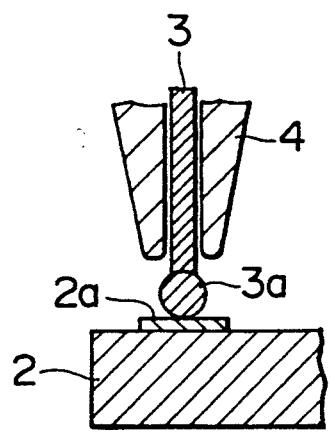
Figure 4:
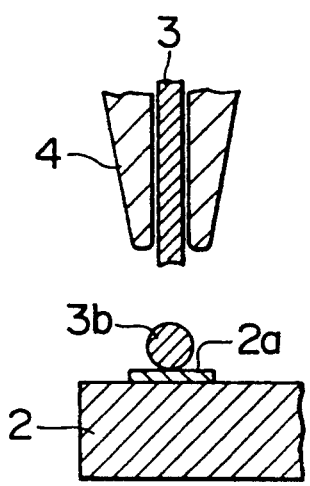

As shown in FIG. 2, the alloy wire 3 thus produced is passed through a capillary tube 4, and then the tip of the alloy wire 3 is heated with an electric torch 5 to form a ball 3a having a hardness of $H_B$ 6 or higher. Then, as shown in FIG. 3, the capillary tube 4 is lowered to attach the ball 3a formed at the tip of the alloy wire 3 to the aluminum alloy wiring line 2a formed on the semiconductor chip 3. The ball 3a having a hardness of $H_B$ 6 or higher disrupts an oxide film coating the surface of the aluminum alloy wiring line 2a having a hardness on the order of $H_B$ 12, and the ball 3a is bonded directly to the aluminum alloy wiring line 2a by the diffusion between the new surface of the ball 3a and the new surface of the aluminum alloy wiring line 2a. Subsequently, as shown in FIG. 4, the capillary 4 is raised to separate the ball 3a from the alloy wire 3 to leave the ball 3a as a bump contact 3b on the aluminum alloy wiring line 2a. When the tip of the alloy wire 3, namely, the ball 3a is heated, the unequilibrated phase disappears and the crystal grains grow large in the junction of the alloy wire 3 and the ball 3a to reduce the tensile strength of the junction, so that the junction yields and breaks readily when the alloy wire 3 is raised by the capillary.

Figure 5:
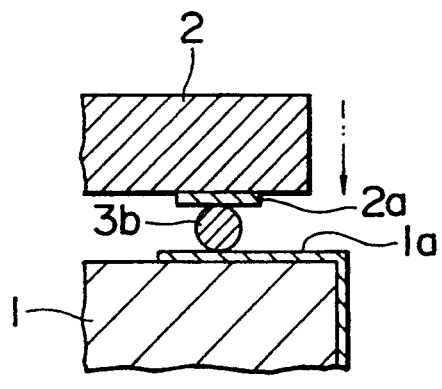

Then, as shown in FIG. 5, semiconductor chip 2 is placed on the substrate 1 with the bump contacts 3b attached to the aluminum alloy wiring lines 2a in contact with the wiring lines 1a of the substrate and then heat and pressure are applied to the bump contact 3b to connect electrically the aluminum alloy wiring lines 2a of the semiconductor chip 2 and the wiring lines 1a of the substrate and also to bond the semiconductor chip 2 to the substrate 1. Although the sphericity of the balls 3b can be improved by heating the balls 3b in the atmosphere of a flux of a chloride or an iodide before placing the balls 3b in contact with the wiring lines 1a of the substrate 1, the balls 3b may be attached to the wiring lines 1a without causing then to reflow.

Figure 6:
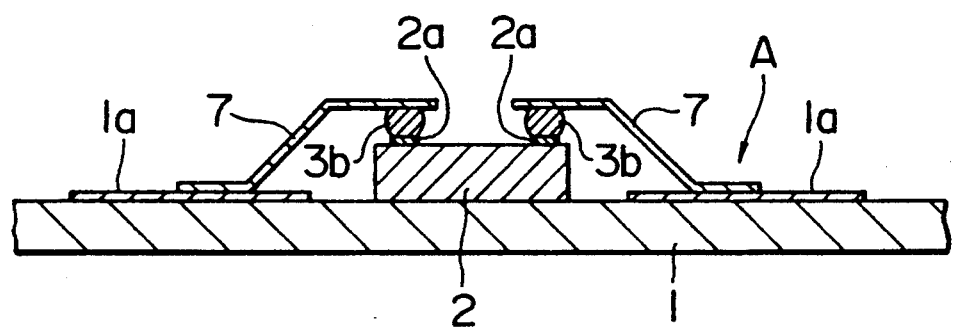
FIG. 6 is a longitudinal sectional view of a semiconductor device in another embodiment according to the present invention.

FIG. 6 shows a semiconductor device A in another embodiment according to the present invention. This semiconductor device a is of a so-called tape carrier bonding type, in which bump contacts 3b are formed on the aluminum alloy wiring lines 2a of a semiconductor chip film leads 7 formed for example, by plating strips of a Cu foil with Sn or Au are bonded to the bump contacts 3b and the wiring lines 1a of a substrate 1.

In the foregoing embodiments, the aluminum alloy wiring lines 2a are formed on the semiconductor chip 2 and the balls 3a are bonded to the aluminum alloy wiring lines 2a as the bump contacts 3b. The wiring lines 1a of the substrate 1 may be formed of an aluminum alloy and the balls 3a may be bonded to the wiring lines 1a of the substrate 1 as the bump contacts 3b.

Tables 1 to 27 show the properties of alloys in comparison with those of controls in terms of the respective compositions of alloys forming alloy wires, the ball forming property of the alloy wires, the hardness of balls formed by heating the alloy wires, and the capability of bonding to the Al—Si alloy wiring lines.

The ball forming property is evaluated by the shape of a ball formed by arc discharge between the tip of a sample alloy wire passed through a ceramic capillary tube and an electrode disposed near the tip of the sample alloy wire in an argon gas atmosphere containing 5% in volume hydrogen gas. In the tables, a circular mark indicates that the ball has satisfactory sphericity and smooth surface morphology.

Thus, the present invention has the following advantages.

The ball of a hardness of $H_B$ 6 or higher formed on the tip of the alloy wire produced by drawing a quench solidified alloy disrupts an oxide film coating the surface of the aluminum alloy wiring line, and the ball and the aluminum alloy wiring line are bonded together metallurgically by mutual diffusion between the new surface of the aluminum alloy wiring line and the new surface of the ball, and hence the ball formed on the tip of the alloy wire can be directly joined as a bump contact to the aluminum alloy wiring line. In other words, for embodiments wherein Sb and Zn are included in the ball, the Sb forms an intermetallic compound with the aluminum alloy wiring line, and the Zn occludes into the aluminum alloy wiring line.

Thus, the present invention enables the omission of a step of removing the oxide film coating the surface of the aluminum alloy wiring line, which reduces time and cost for assembling the semiconductor device.

Although the invention has been described in its preferred forms with a certain degree of particularity, obviously, many changes and variations are possible therein. It is therefore to be understood that the present invention may be practiced otherwise than as specifically described herein without departing from the scope and spirit thereof.

TABLE 1

| Composition (% by wt.) | | | | | | | | | | | | | Ball Formation | $H_B$ | Bonding Property |
|---|---|---|---|---|---|---|---|---|---|---|---|---|---|---|---|
| Pb | Sn | In | Sb | Cu | Ni | Bi | Zn | Ag | Au | Pt | Pd | Others | | | |
| Balance | 2 | | 0.5 | 0.05 | | | | | | | | | ◯ | 5 | Bad |
| Balance | 2 | | 0.5 | 0.1 | | | | | | | | | ◯ | 5 | Bad |
| Balance | 2 | | 0.5 | 1.0 | | | | | | | | | ◯ | 5 | Bad |
| Balance | 2 | | 0.5 | 0.05 | | | | 0.1 | | | | | ◯ | 5 | Bad |
| Balance | 2 | | 0.5 | 0.1 | | | | 0.3 | | | | | ◯ | 5 | Bad |
| Balance | 2 | | 0.5 | 0.1 | | | | 0.5 | | | | | ◯ | 5 | Bad |
| Balance | 2 | | 0.5 | 0.5 | | | | 1.0 | | | | | ◯ | 6 | Good |
| Balance | 2 | | 0.5 | 1.0 | | | | 1.5 | | | | | ◯ | 6 | Good |
| Balance | 2 | | 0.5 | 0.05 | | | | | 0.1 | | | | ◯ | 5 | Bad |
| Balance | 2 | | 0.5 | 0.1 | | | | | 0.3 | | | | ◯ | 5 | Bad |
| Balance | 2 | | 0.5 | 0.1 | | | | | 0.5 | | | | ◯ | 5 | Bad |
| Balance | 2 | | 0.5 | 0.5 | | | | | 1.0 | | | | ◯ | 6 | Good |
| Balance | 2 | | 0.5 | 1.0 | | | | | 1.5 | | | | ◯ | 6 | Good |
| Balance | 2 | | 0.5 | 0.05 | | | | | | 0.1 | | | ◯ | 5 | Bad |
| Balance | 2 | | 0.5 | 0.1 | | | | | | 0.3 | | | ◯ | 5 | Bad |

TABLE 1-continued

| | Composition (% by wt.) | | | | | | | | | | | | | |
|---|---|---|---|---|---|---|---|---|---|---|---|---|---|---|
| Pb | Sn | In | Sb | Cu | Ni | Bi | Zn | Ag | Au | Pt | Pd | Others | Ball Formation | H$_B$ | Bonding Property |
| Balance | 2 | 0.5 | 0.1 | | | | | | | 0.5 | | | ○ | 5 | Bad |
| Balance | 2 | 0.5 | 0.5 | | | | | | | 1.0 | | | ○ | 6 | Good |
| Balance | 2 | 0.5 | 1.0 | | | | | | | 1.5 | | | ○ | 6 | Good |
| Balance | 2 | 0.5 | | 0.05 | | | | 0.1 | | | | | ○ | 5 | Bad |
| Balance | 2 | 0.5 | | 0.1 | | | | 0.3 | | | | | ○ | 5 | Bad |
| Balance | 2 | 0.5 | | 0.1 | | | | 0.5 | | | | | ○ | 5 | Bad |
| Balance | 2 | 0.5 | | 0.5 | | | | 1.0 | | | | | ○ | 6 | Good |
| Balance | 2 | 0.5 | | 1.0 | | | | 1.5 | | | | | ○ | 6 | Good |
| Balance | 2 | 0.5 | | 0.05 | | | | | 0.1 | | | | ○ | 5 | Bad |
| Balance | 2 | 0.5 | | 0.1 | | | | | 0.3 | | | | ○ | 5 | Bad |
| Balance | 2 | 0.5 | | 0.1 | | | | | 0.5 | | | | ○ | 5 | Bad |
| Balance | 2 | 0.5 | | 0.5 | | | | | 1.0 | | | | ○ | 6 | Good |
| Balance | 2 | 0.5 | | 1.0 | | | | | 1.5 | | | | ○ | 6 | Good |
| Balance | 2 | 0.5 | | 0.05 | | | | | | 0.1 | | | ○ | 5 | Bad |
| Balance | 2 | 0.5 | | 0.1 | | | | | | 0.3 | | | ○ | 5 | Bad |
| Balance | 2 | 0.5 | | 0.1 | | | | | | 0.5 | | | ○ | 5 | Bad |
| Balance | 2 | 0.5 | | 0.5 | | | | | | 1.0 | | | ○ | 6 | Good |
| Balance | 2 | 0.5 | | 1.0 | | | | | | 1.5 | | | ○ | 6 | Good |

TABLE 2

| | Composition (% by wt.) | | | | | | | | | | | | | |
|---|---|---|---|---|---|---|---|---|---|---|---|---|---|---|
| Pb | Sn | In | Sb | Cu | Ni | Bi | Zn | Ag | Au | Pt | Pd | Others | Ball Formation | H$_B$ | Bonding Property |
| Balance | 5 | | 1 | 0.1 | | | | | | | | | ○ | 5 | Bad |
| Balance | 5 | | 3 | 0.2 | | | | | | | | | ○ | 6 | Good |
| Balance | 5 | | 5 | 0.5 | | | | | | | | | ○ | 6 | Good |
| Balance | 5 | | 10 | 1.0 | | | | | | | | | ○ | 7 | Good |
| Balance | 5 | | 1 | 0.1 | | | | 1 | | | | | ○ | 5 | Bad |
| Balance | 5 | | 3 | 0.2 | | | | 2 | | | | | ○ | 6 | Good |
| Balance | 5 | | 5 | 0.5 | | | | 3 | | | | | ○ | 6 | Good |
| Balance | 5 | | 10 | 1.0 | | | | 5 | | | | | ○ | 7 | Good |
| Balance | 5 | | 1 | | 0.1 | | | | | | | | ○ | 5 | Bad |
| Balance | 5 | | 3 | | 0.2 | | | | | | | | ○ | 6 | Good |
| Balance | 5 | | 5 | | 0.5 | | | | | | | | ○ | 6 | Good |
| Balance | 5 | | 10 | | 1.0 | | | | | | | | ○ | 7 | Good |
| Balance | 5 | | 1 | | 0.1 | | | 1 | | | | | ○ | 5 | Bad |
| Balance | 5 | | 3 | | 0.2 | | | 2 | | | | | ○ | 6 | Good |
| Balance | 5 | | 5 | | 0.5 | | | 3 | | | | | ○ | 6 | Good |
| Balance | 5 | | 10 | | 1.0 | | | 5 | | | | | ○ | 7 | Good |
| Balance | 5 | | | 0.1 | 1 | | | | | | | | ○ | 5 | Bad |
| Balance | 5 | | | 0.2 | 3 | | | | | | | | ○ | 6 | Good |
| Balance | 5 | | | 0.5 | 5 | | | | | | | | ○ | 6 | Good |
| Balance | 5 | | | 1.0 | 10 | | | | | | | | ○ | 7 | Good |
| Balance | 5 | | | 0.1 | 1 | | | 1 | | | | | ○ | 5 | Bad |
| Balance | 5 | | | 0.2 | 3 | | | 2 | | | | | ○ | 6 | Good |
| Balance | 5 | | | 0.5 | 5 | | | 3 | | | | | ○ | 6 | Good |
| Balance | 5 | | | 1.0 | 10 | | | 5 | | | | | ○ | 7 | Good |
| Balance | 5 | | | | 0.1 | 1 | | | | | | | ○ | 5 | Bad |
| Balance | 5 | | | | 0.2 | 3 | | | | | | | ○ | 6 | Good |
| Balance | 5 | | | | 0.5 | 5 | | | | | | | ○ | 6 | Good |
| Balance | 5 | | | | 1.0 | 10 | | | | | | | ○ | 7 | Good |
| Balance | 5 | | | | 0.1 | 1 | | 1 | | | | | ○ | 5 | Bad |
| Balance | 5 | | | | 0.2 | 3 | | 2 | | | | | ○ | 6 | Good |
| Balance | 5 | | | | 0.5 | 5 | | 3 | | | | | ○ | 6 | Good |
| Balance | 5 | | | | 1.0 | 10 | | 5 | | | | | ○ | 7 | Good |

TABLE 3

| | Composition (% by wt.) | | | | | | | | | | | | | |
|---|---|---|---|---|---|---|---|---|---|---|---|---|---|---|
| Pb | Sn | In | Sb | Cu | Ni | Bi | Zn | Ag | Au | Pt | Pd | Others | Ball Formation | H$_B$ | Bonding Property |
| Balance | 5 | | 1 | 0.05 | | | | 0.1 | | | | | ○ | 5 | Bad |
| Balance | 5 | | 3 | 0.1 | | | | 0.3 | | | | | ○ | 6 | Good |
| Balance | 5 | | 5 | 0.1 | | | | 0.5 | | | | | ○ | 6 | Good |
| Balance | 5 | | 5 | 0.5 | | | | 1.0 | | | | | ○ | 6 | Good |
| Balance | 5 | | 7 | 0.7 | | | | 1.5 | | | | | ○ | 7 | Good |
| Balance | 5 | | 10 | 1.0 | | | | 2.0 | | | | | ○ | 8 | Good |
| Balance | 5 | | 1 | 0.05 | | | | | 0.1 | | | | ○ | 5 | Bad |
| Balance | 5 | | 3 | 0.1 | | | | | 0.3 | | | | ○ | 6 | Good |
| Balance | 5 | | 5 | 0.1 | | | | | 0.5 | | | | ○ | 6 | Good |
| Balance | 5 | | 5 | 0.5 | | | | | 1.0 | | | | ○ | 6 | Good |
| Balance | 5 | | 7 | 0.7 | | | | | 1.5 | | | | ○ | 7 | Good |
| Balance | 5 | | 10 | 1.0 | | | | | 2.0 | | | | ○ | 8 | Good |
| Balance | 5 | | 1 | 0.05 | | | | | | 0.1 | | | ○ | 5 | Bad |
| Balance | 5 | | 3 | 0.1 | | | | | | 0.3 | | | ○ | 6 | Good |
| Balance | 5 | | 5 | 0.1 | | | | | | 0.5 | | | ○ | 6 | Good |
| Balance | 5 | | 5 | 0.5 | | | | | | 1.0 | | | ○ | 6 | Good |

TABLE 3-continued

| Composition (% by wt.) | | | | | | | | | | | | | Ball Formation | H_B | Bonding Property |
|---|---|---|---|---|---|---|---|---|---|---|---|---|---|---|---|
| Pb | Sn | In | Sb | Cu | Ni | Bi | Zn | Ag | Au | Pt | Pd | Others | | | |
| Balance | 5 | 7 | 0.7 | | | | | | | | 1.5 | | ○ | 7 | Good |
| Balance | 5 | 10 | 1.0 | | | | | | | | 2.0 | | ○ | 8 | Good |
| Balance | 5 | 1 | | 0.05 | | | | 0.1 | | | | | ○ | 5 | Bad |
| Balance | 5 | 3 | | 0.1 | | | | 0.3 | | | | | ○ | 6 | Good |
| Balance | 5 | 5 | | 0.5 | | | | 0.5 | | | | | ○ | 6 | Good |
| Balance | 5 | 7 | | 0.7 | | | | 1.5 | | | | | ○ | 7 | Good |
| Balance | 5 | 10 | | 1.0 | | | | 2.0 | | | | | ○ | 8 | Good |
| Balance | 5 | 1 | | 0.05 | | | | | 0.1 | | | | ○ | 5 | Bad |
| Balance | 5 | 3 | | 0.1 | | | | | 0.3 | | | | ○ | 6 | Good |
| Balance | 5 | 5 | | 0.5 | | | | | 0.5 | | | | ○ | 6 | Good |
| Balance | 5 | 7 | | 0.7 | | | | | 1.5 | | | | ○ | 7 | Good |
| Balance | 5 | 10 | | 1.0 | | | | | 2.0 | | | | ○ | 8 | Good |
| Balance | 5 | 1 | | 0.05 | | | | | | 0.1 | | | ○ | 5 | Bad |
| Balance | 5 | 3 | | 0.1 | | | | | | 0.3 | | | ○ | 6 | Good |
| Balance | 5 | 5 | | 0.5 | | | | | | 0.5 | | | ○ | 6 | Good |
| Balance | 5 | 7 | | 0.7 | | | | | | 1.5 | | | ○ | 7 | Good |
| Balance | 5 | 10 | | 1.0 | | | | | | 2.0 | | | ○ | 8 | Good |

TABLE 4

| Composition (% by wt.) | | | | | | | | | | | | | Ball Formation | H_B | Bonding Property |
|---|---|---|---|---|---|---|---|---|---|---|---|---|---|---|---|
| Pb | Sn | In | Sb | Cu | Ni | Bi | Zn | Ag | Au | Pt | Pd | Others | | | |
| Balance | 10 | | 1 | 0.1 | | | | | | | | | ○ | 6 | Good |
| Balance | 10 | | 3 | 0.5 | | | | | | | | | ○ | 7 | Good |
| Balance | 10 | | 5 | 1.0 | | | | | | | | | ○ | 7 | Good |
| Balance | 10 | | 10 | 1.5 | | | | | | | | | ○ | 8 | Good |
| Balance | 10 | | 1 | 0.1 | | | 1 | | | | | | ○ | 6 | Good |
| Balance | 10 | | 3 | 0.5 | | | 2 | | | | | | ○ | 7 | Good |
| Balance | 10 | | 5 | 1.0 | | | 3 | | | | | | ○ | 7 | Good |
| Balance | 10 | | 10 | 1.5 | | | 5 | | | | | | ○ | 8 | Good |
| Balance | 10 | | 1 | | 0.1 | | | | | | | | ○ | 6 | Good |
| Balance | 10 | | 3 | | 0.5 | | | | | | | | ○ | 7 | Good |
| Balance | 10 | | 5 | | 1.0 | | | | | | | | ○ | 7 | Good |
| Balance | 10 | | 10 | | 1.5 | | | | | | | | ○ | 8 | Good |
| Balance | 10 | | 1 | | 0.1 | | 1 | | | | | | ○ | 6 | Good |
| Balance | 10 | | 3 | | 0.5 | | 2 | | | | | | ○ | 7 | Good |
| Balance | 10 | | 5 | | 1.0 | | 3 | | | | | | ○ | 7 | Good |
| Balance | 10 | | 10 | | 1.5 | | 5 | | | | | | ○ | 8 | Good |
| Balance | 10 | | | 0.1 | 1 | | | | | | | | ○ | 6 | Good |
| Balance | 10 | | | 0.5 | 3 | | | | | | | | ○ | 7 | Good |
| Balance | 10 | | | 1.0 | 5 | | | | | | | | ○ | 7 | Good |
| Balance | 10 | | | 1.5 | 10 | | | | | | | | ○ | 8 | Good |
| Balance | 10 | | | 0.1 | 1 | | 1 | | | | | | ○ | 6 | Good |
| Balance | 10 | | | 0.5 | 3 | | 2 | | | | | | ○ | 7 | Good |
| Balance | 10 | | | 1.0 | 5 | | 3 | | | | | | ○ | 7 | Good |
| Balance | 10 | | | 1.5 | 10 | | 5 | | | | | | ○ | 8 | Good |
| Balance | 10 | | | | 0.1 | 1 | | | | | | | ○ | 6 | Good |
| Balance | 10 | | | | 0.5 | 3 | | | | | | | ○ | 7 | Good |
| Balance | 10 | | | | 1.0 | 5 | | | | | | | ○ | 7 | Good |
| Balance | 10 | | | | 1.5 | 10 | | | | | | | ○ | 8 | Good |
| Balance | 10 | | | | 0.1 | 1 | 1 | | | | | | ○ | 6 | Good |
| Balance | 10 | | | | 0.5 | 3 | 2 | | | | | | ○ | 7 | Good |
| Balance | 10 | | | | 1.0 | 5 | 3 | | | | | | ○ | 7 | Good |
| Balance | 10 | | | | 1.5 | 10 | 5 | | | | | | ○ | 8 | Good |

TABLE 5

| Composition (% by wt.) | | | | | | | | | | | | | Ball Formation | H_B | Bonding Property |
|---|---|---|---|---|---|---|---|---|---|---|---|---|---|---|---|
| Pb | Sn | In | Sb | Cu | Ni | Bi | Zn | Ag | Au | Pt | Pd | Others | | | |
| Balance | 10 | | 1 | 0.05 | | | | 0.1 | | | | | ○ | 6 | Good |
| Balance | 10 | | 3 | 0.1 | | | | 0.3 | | | | | ○ | 7 | Good |
| Balance | 10 | | 5 | 0.1 | | | | 0.5 | | | | | ○ | 7 | Good |
| Balance | 10 | | 5 | 0.5 | | | | 1.0 | | | | | ○ | 7 | Good |
| Balance | 10 | | 7 | 1.0 | | | | 1.5 | | | | | ○ | 8 | Good |
| Balance | 10 | | 10 | 1.5 | | | | 2.0 | | | | | ○ | 8 | Good |
| Balance | 10 | | 1 | 0.05 | | | | | 0.1 | | | | ○ | 6 | Good |
| Balance | 10 | | 3 | 0.1 | | | | | 0.3 | | | | ○ | 7 | Good |
| Balance | 10 | | 5 | 0.1 | | | | | 0.5 | | | | ○ | 7 | Good |
| Balance | 10 | | 5 | 0.5 | | | | | 1.0 | | | | ○ | 7 | Good |
| Balance | 10 | | 7 | 1.0 | | | | | 1.5 | | | | ○ | 8 | Good |
| Balance | 10 | | 10 | 1.5 | | | | | 2.0 | | | | ○ | 8 | Good |
| Balance | 10 | | 1 | 0.05 | | | | | | 0.1 | | | ○ | 6 | Good |
| Balance | 10 | | 3 | 0.1 | | | | | | 0.3 | | | ○ | 7 | Good |
| Balance | 10 | | 5 | 0.1 | | | | | | 0.5 | | | ○ | 7 | Good |
| Balance | 10 | | 5 | 0.5 | | | | | | 1.0 | | | ○ | 7 | Good |
| Balance | 10 | | 7 | 1.0 | | | | | | 1.5 | | | ○ | 8 | Good |

TABLE 5-continued

| Composition (% by wt.) | | | | | | | | | | | | Ball Formation | $H_B$ | Bonding Property |
|---|---|---|---|---|---|---|---|---|---|---|---|---|---|---|
| Pb | Sn | In | Sb | Cu | Ni | Bi | Zn | Ag | Au | Pt | Pd | Others | | |
| Balance | 10 | | 10 | 1.5 | | | | | | | 2.0 | | ◯ | 8 | Good |
| Balance | 10 | | 1 | 0.05 | | | | 0.1 | | | | | ◯ | 6 | Good |
| Balance | 10 | | 3 | 0.1 | | | | 0.3 | | | | | ◯ | 7 | Good |
| Balance | 10 | | 5 | 0.5 | | | | 0.5 | | | | | ◯ | 7 | Good |
| Balance | 10 | | 7 | 1.0 | | | | 1.5 | | | | | ◯ | 8 | Good |
| Balance | 10 | | 10 | 1.5 | | | | 2.0 | | | | | ◯ | 8 | Good |
| Balance | 10 | | 1 | 0.05 | | | | | 0.1 | | | | ◯ | 6 | Good |
| Balance | 10 | | 3 | 0.1 | | | | | 0.3 | | | | ◯ | 7 | Good |
| Balance | 10 | | 5 | 0.5 | | | | | 0.5 | | | | ◯ | 7 | Good |
| Balance | 10 | | 7 | 1.0 | | | | | 1.5 | | | | ◯ | 8 | Good |
| Balance | 10 | | 10 | 1.5 | | | | | 2.0 | | | | ◯ | 8 | Good |
| Balance | 10 | | 1 | 0.05 | | | | | | 0.1 | | | ◯ | 6 | Good |
| Balance | 10 | | 3 | 0.1 | | | | | | 0.3 | | | ◯ | 7 | Good |
| Balance | 10 | | 5 | 0.5 | | | | | | 0.5 | | | ◯ | 7 | Good |
| Balance | 10 | | 7 | 1.0 | | | | | | 1.5 | | | ◯ | 8 | Good |
| Balance | 10 | | 10 | 1.5 | | | | | | 2.0 | | | ◯ | 8 | Good |

TABLE 6

| Composition (% by wt.) | | | | | | | | | | | | Ball Formation | $H_B$ | Bonding Property |
|---|---|---|---|---|---|---|---|---|---|---|---|---|---|---|
| Pb | Sn | In | Sb | Cu | Ni | Bi | Zn | Ag | Au | Pt | Pd | Others | | |
| Balance | 30 | | 1 | 0.1 | | | | | | | | | ◯ | 7 | Good |
| Balance | 30 | | 3 | 0.5 | | | | | | | | | ◯ | 8 | Good |
| Balance | 30 | | 5 | 1.0 | | | | | | | | | ◯ | 8 | Good |
| Balance | 30 | | 10 | 1.5 | | | | | | | | | ◯ | 9 | Good |
| Balance | 30 | | 1 | 0.1 | | | | 1 | | | | | ◯ | 7 | Good |
| Balance | 30 | | 3 | 0.5 | | | | 2 | | | | | ◯ | 8 | Good |
| Balance | 30 | | 5 | 1.0 | | | | 3 | | | | | ◯ | 8 | Good |
| Balance | 30 | | 10 | 1.5 | | | | 5 | | | | | ◯ | 9 | Good |
| Balance | 30 | | 1 | | 0.1 | | | | | | | | ◯ | 7 | Good |
| Balance | 30 | | 3 | | 0.5 | | | | | | | | ◯ | 8 | Good |
| Balance | 30 | | 5 | | 1.0 | | | | | | | | ◯ | 8 | Good |
| Balance | 30 | | 10 | | 1.5 | | | | | | | | ◯ | 9 | Good |
| Balance | 30 | | 1 | | 0.1 | | | 1 | | | | | ◯ | 7 | Good |
| Balance | 30 | | 3 | | 0.5 | | | 2 | | | | | ◯ | 8 | Good |
| Balance | 30 | | 5 | | 1.0 | | | 3 | | | | | ◯ | 8 | Good |
| Balance | 30 | | 10 | | 1.5 | | | 5 | | | | | ◯ | 9 | Good |
| Balance | 30 | | | 0.1 | 1 | | | | | | | | ◯ | 7 | Good |
| Balance | 30 | | | 0.5 | 2 | | | | | | | | ◯ | 8 | Good |
| Balance | 30 | | | 0.7 | 5 | | | | | | | | ◯ | 8 | Good |
| Balance | 30 | | | 1.0 | 7 | | | | | | | | ◯ | 9 | Good |
| Balance | 30 | | | 1.5 | 10 | | | | | | | | ◯ | 10 | Good |
| Balance | 30 | | | 1.0 | 1 | | | 1 | | | | | ◯ | 7 | Good |
| Balance | 30 | | | 0.5 | 2 | | | 2 | | | | | ◯ | 8 | Good |
| Balance | 30 | | | 1.0 | 5 | | | 3 | | | | | ◯ | 8 | Good |
| Balance | 30 | | | 1.5 | 10 | | | 5 | | | | | ◯ | 9 | Good |
| Balance | 30 | | 1 | | | | 0.05 | | | | | | ◯ | 7 | Good |
| Balance | 30 | | 3 | | | | 0.1 | | | | | | ◯ | 8 | Good |
| Balance | 30 | | 5 | | | | 1.0 | | | | | | ◯ | 8 | Good |
| Balance | 30 | | 10 | | | | 3.0 | | | | | | ◯ | 9 | Good |
| Balance | 30 | | 1 | | | | 0.05 | 1 | | | | | ◯ | 7 | Good |
| Balance | 30 | | 3 | | | | 0.1 | 2 | | | | | ◯ | 8 | Good |
| Balance | 30 | | 5 | | | | 1.0 | 3 | | | | | ◯ | 8 | Good |
| Balance | 30 | | 10 | | | | 3.0 | 5 | | | | | ◯ | 9 | Good |

TABLE 7

| Composition (% by wt.) | | | | | | | | | | | | Ball Formation | $H_B$ | Bonding Property |
|---|---|---|---|---|---|---|---|---|---|---|---|---|---|---|
| Pb | Sn | In | Sb | Cu | Ni | Bi | Zn | Ag | Au | Pt | Pd | Others | | |
| Balance | 30 | | 1 | 0.05 | | | | 0.1 | | | | | ◯ | 7 | Good |
| Balance | 30 | | 3 | 0.1 | | | | 0.3 | | | | | ◯ | 8 | Good |
| Balance | 30 | | 5 | 0.1 | | | | 0.5 | | | | | ◯ | 8 | Good |
| Balance | 30 | | 5 | 0.5 | | | | 1.0 | | | | | ◯ | 8 | Good |
| Balance | 30 | | 7 | 1.0 | | | | 1.5 | | | | | ◯ | 9 | Good |
| Balance | 30 | | 10 | 1.5 | | | | 2.0 | | | | | ◯ | 10 | Good |
| Balance | 30 | | 1 | 0.05 | | | | | 0.1 | | | | ◯ | 7 | Good |
| Balance | 30 | | 3 | 0.1 | | | | | 0.3 | | | | ◯ | 8 | Good |
| Balance | 30 | | 5 | 0.1 | | | | | 0.5 | | | | ◯ | 8 | Good |
| Balance | 30 | | 5 | 0.5 | | | | | 1.0 | | | | ◯ | 8 | Good |
| Balance | 30 | | 7 | 1.0 | | | | | 1.5 | | | | ◯ | 9 | Good |
| Balance | 30 | | 10 | 1.5 | | | | | 2.0 | | | | ◯ | 10 | Good |
| Balance | 30 | | 1 | 0.05 | | | | | | 0.1 | | | ◯ | 7 | Good |
| Balance | 30 | | 3 | 0.1 | | | | | | 0.3 | | | ◯ | 8 | Good |
| Balance | 30 | | 5 | 0.1 | | | | | | 0.5 | | | ◯ | 8 | Good |
| Balance | 30 | | 5 | 0.5 | | | | | | 1.0 | | | ◯ | 8 | Good |
| Balance | 30 | | 7 | 1.0 | | | | | | 1.5 | | | ◯ | 9 | Good |

TABLE 7-continued

| Pb | Sn | In | Sb | Cu | Ni | Bi | Zn | Ag | Au | Pt | Pd | Others | Ball Formation | H$_B$ | Bonding Property |
|---|---|---|---|---|---|---|---|---|---|---|---|---|---|---|---|
| Balance | 30 | 10 | 1.5 | | | | | | 2.0 | | | | ○ | 10 | Good |
| Balance | 30 | 1 | | 0.05 | | | | 0.1 | | | | | ○ | 7 | Good |
| Balance | 30 | 3 | | 0.1 | | | | 0.3 | | | | | ○ | 8 | Good |
| Balance | 30 | 5 | | 0.5 | | | | 0.5 | | | | | ○ | 8 | Good |
| Balance | 30 | 7 | | 1.0 | | | | 1.5 | | | | | ○ | 9 | Good |
| Balance | 30 | 10 | | 1.5 | | | | 2.0 | | | | | ○ | 10 | Good |
| Balance | 30 | 1 | | 0.05 | | | | | 0.1 | | | | ○ | 7 | Good |
| Balance | 30 | 3 | | 0.1 | | | | | 0.3 | | | | ○ | 8 | Good |
| Balance | 30 | 5 | | 0.5 | | | | | 0.5 | | | | ○ | 8 | Good |
| Balance | 30 | 7 | | 1.0 | | | | | 1.5 | | | | ○ | 9 | Good |
| Balance | 30 | 10 | | 1.5 | | | | | 2.0 | | | | ○ | 10 | Good |
| Balance | 30 | 1 | | 0.05 | | | | | | 0.1 | | | ○ | 7 | Good |
| Balance | 30 | 3 | | 0.1 | | | | | | 0.3 | | | ○ | 8 | Good |
| Balance | 30 | 5 | | 0.5 | | | | | | 0.5 | | | ○ | 8 | Good |
| Balance | 30 | 7 | | 1.0 | | | | | | 1.5 | | | ○ | 9 | Good |
| Balance | 30 | 10 | | 1.5 | | | | | | 2.0 | | | ○ | 10 | Good |

TABLE 8

| Pb | Sn | In | Sb | Cu | Ni | Bi | Zn | Ag | Au | Pt | Pd | Others | Ball Formation | H$_B$ | Bonding Property |
|---|---|---|---|---|---|---|---|---|---|---|---|---|---|---|---|
| Balance | 40 | 1 | 0.1 | | | | | | | | | | ○ | 8 | Good |
| Balance | 40 | 3 | 0.5 | | | | | | | | | | ○ | 9 | Good |
| Balance | 40 | 5 | 1.0 | | | | | | | | | | ○ | 9 | Good |
| Balance | 40 | 10 | 1.5 | | | | | | | | | | ○ | 10 | Good |
| Balance | 40 | 1 | 0.1 | | | | 1 | | | | | | ○ | 8 | Good |
| Balance | 40 | 3 | 0.5 | | | | 2 | | | | | | ○ | 9 | Good |
| Balance | 40 | 5 | 1.0 | | | | 3 | | | | | | ○ | 9 | Good |
| Balance | 40 | 10 | 1.5 | | | | 5 | | | | | | ○ | 10 | Good |
| Balance | 40 | 1 | | 0.1 | | | | | | | | | ○ | 8 | Good |
| Balance | 40 | 3 | | 0.5 | | | | | | | | | ○ | 9 | Good |
| Balance | 40 | 5 | | 1.0 | | | | | | | | | ○ | 9 | Good |
| Balance | 40 | 10 | | 1.5 | | | | | | | | | ○ | 10 | Good |
| Balance | 40 | 1 | | 0.1 | | | 1 | | | | | | ○ | 8 | Good |
| Balance | 40 | 3 | | 0.5 | | | 2 | | | | | | ○ | 9 | Good |
| Balance | 40 | 5 | | 1.0 | | | 3 | | | | | | ○ | 9 | Good |
| Balance | 40 | 10 | | 1.5 | | | 5 | | | | | | ○ | 10 | Good |
| Balance | 40 | | 0.1 | 1 | | | | | | | | | ○ | 8 | Good |
| Balance | 40 | | 0.5 | 2 | | | | | | | | | ○ | 9 | Good |
| Balance | 40 | | 0.7 | 5 | | | | | | | | | ○ | 9 | Good |
| Balance | 40 | | 1.0 | 7 | | | | | | | | | ○ | 9 | Good |
| Balance | 40 | | 1.5 | 10 | | | | | | | | | ○ | 10 | Good |
| Balance | 40 | | 0.1 | 1 | | | 1 | | | | | | ○ | 8 | Good |
| Balance | 40 | | 0.5 | 2 | | | 2 | | | | | | ○ | 9 | Good |
| Balance | 40 | | 1.0 | 5 | | | 3 | | | | | | ○ | 9 | Good |
| Balance | 40 | | 1.5 | 10 | | | 5 | | | | | | ○ | 10 | Good |
| Balance | 40 | 1 | | | | | 0.05 | | | | | | ○ | 8 | Good |
| Balance | 40 | 3 | | | | | 0.1 | | | | | | ○ | 9 | Good |
| Balance | 40 | 5 | | | | | 1.0 | | | | | | ○ | 9 | Good |
| Balance | 40 | 10 | | | | | 3.0 | | | | | | ○ | 10 | Good |
| Balance | 40 | 1 | | | | | 0.05 | 1 | | | | | ○ | 8 | Good |
| Balance | 40 | 3 | | | | | 0.1 | 2 | | | | | ○ | 9 | Good |
| Balance | 40 | 5 | | | | | 1.0 | 3 | | | | | ○ | 9 | Good |
| Balance | 40 | 10 | | | | | 3.0 | 5 | | | | | ○ | 10 | Good |

TABLE 9

| Pb | Sn | In | Sb | Cu | Ni | Bi | Zn | Ag | Au | Pt | Pd | Others | Ball Formation | H$_B$ | Bonding Property |
|---|---|---|---|---|---|---|---|---|---|---|---|---|---|---|---|
| Balance | 40 | 1 | | 0.05 | | | | 0.1 | | | | | ○ | 8 | Good |
| Balance | 40 | 3 | | 0.1 | | | | 0.3 | | | | | ○ | 9 | Good |
| Balance | 40 | 5 | | 0.1 | | | | 0.5 | | | | | ○ | 9 | Good |
| Balance | 40 | 5 | | 0.5 | | | | 1.0 | | | | | ○ | 9 | Good |
| Balance | 40 | 7 | | 1.0 | | | | 1.5 | | | | | ○ | 9 | Good |
| Balance | 40 | 10 | | 1.5 | | | | 2.0 | | | | | ○ | 10 | Good |
| Balance | 40 | 1 | | 0.05 | | | | | 0.1 | | | | ○ | 8 | Good |
| Balance | 40 | 3 | | 0.1 | | | | | 0.3 | | | | ○ | 9 | Good |
| Balance | 40 | 5 | | 0.1 | | | | | 0.5 | | | | ○ | 9 | Good |
| Balance | 40 | 5 | | 0.5 | | | | | 1.0 | | | | ○ | 9 | Good |
| Balance | 40 | 7 | | 1.0 | | | | | 1.5 | | | | ○ | 9 | Good |
| Balance | 40 | 10 | | 1.5 | | | | | 2.0 | | | | ○ | 10 | Good |
| Balance | 40 | 1 | | 0.05 | | | | | | 0.1 | | | ○ | 8 | Good |
| Balance | 40 | 3 | | 0.1 | | | | | | 0.3 | | | ○ | 9 | Good |
| Balance | 40 | 5 | | 0.1 | | | | | | 0.5 | | | ○ | 9 | Good |
| Balance | 40 | 5 | | 0.5 | | | | | | 1.0 | | | ○ | 9 | Good |
| Balance | 40 | 7 | | 1.0 | | | | | | 1.5 | | | ○ | 9 | Good |

TABLE 9-continued

| Pb | Sn | In | Sb | Cu | Ni | Bi | Zn | Ag | Au | Pt | Pd | Others | Ball Formation | H$_B$ | Bonding Property |
|---|---|---|---|---|---|---|---|---|---|---|---|---|---|---|---|
| Balance | 40 | 10 | 1.5 | | | | | | | 2.0 | | | ○ | 10 | Good |
| Balance | 40 | 1 | | 0.05 | | | 0.1 | | | | | | ○ | 8 | Good |
| Balance | 40 | 3 | | 0.1 | | | 0.3 | | | | | | ○ | 9 | Good |
| Balance | 40 | 5 | | 0.5 | | | 0.5 | | | | | | ○ | 9 | Good |
| Balance | 40 | 7 | | 1.0 | | | 1.5 | | | | | | ○ | 9 | Good |
| Balance | 40 | 10 | | 1.5 | | | 2.0 | | | | | | ○ | 10 | Good |
| Balance | 40 | 1 | | 0.05 | | | | 0.1 | | | | | ○ | 8 | Good |
| Balance | 40 | 3 | | 0.1 | | | | 0.3 | | | | | ○ | 9 | Good |
| Balance | 40 | 5 | | 0.5 | | | | 0.5 | | | | | ○ | 9 | Good |
| Balance | 40 | 7 | | 1.0 | | | | 1.5 | | | | | ○ | 9 | Good |
| Balance | 40 | 10 | | 1.5 | | | | 2.0 | | | | | ○ | 10 | Good |
| Balance | 40 | 1 | | 0.05 | | | | | 0.1 | | | | ○ | 8 | Good |
| Balance | 40 | 3 | | 0.1 | | | | | 0.3 | | | | ○ | 9 | Good |
| Balance | 40 | 5 | | 0.5 | | | | | 0.5 | | | | ○ | 9 | Good |
| Balance | 40 | 7 | | 1.0 | | | | | 1.5 | | | | ○ | 9 | Good |
| Balance | 40 | 10 | | 1.5 | | | | | 2.0 | | | | ○ | 10 | Good |

TABLE 10

| Pb | Sn | In | Sb | Cu | Ni | Bi | Zn | Ag | Au | Pt | Pd | Others | Ball Formation | H$_B$ | Bonding Property |
|---|---|---|---|---|---|---|---|---|---|---|---|---|---|---|---|
| Balance | 50 | 1 | 0.1 | | | | | | | | | | ○ | 10 | Good |
| Balance | 50 | 3 | 0.5 | | | | | | | | | | ○ | 10 | Good |
| Balance | 50 | 5 | 1.0 | | | | | | | | | | ○ | 11 | Good |
| Balance | 50 | 10 | 1.5 | | | | | | | | | | ○ | 11 | Good |
| Balance | 50 | 1 | 0.1 | | | | 1 | | | | | | ○ | 10 | Good |
| Balance | 50 | 3 | 0.5 | | | | 2 | | | | | | ○ | 10 | Good |
| Balance | 50 | 5 | 1.0 | | | | 3 | | | | | | ○ | 11 | Good |
| Balance | 50 | 10 | 1.5 | | | | 5 | | | | | | ○ | 11 | Good |
| Balance | 50 | 1 | | 0.1 | | | | | | | | | ○ | 10 | Good |
| Balance | 50 | 3 | | 0.5 | | | | | | | | | ○ | 10 | Good |
| Balance | 50 | 5 | | 1.0 | | | | | | | | | ○ | 11 | Good |
| Balance | 50 | 10 | | 1.5 | | | | | | | | | ○ | 11 | Good |
| Balance | 50 | 1 | | 0.1 | | | 1 | | | | | | ○ | 10 | Good |
| Balance | 50 | 3 | | 0.5 | | | 2 | | | | | | ○ | 10 | Good |
| Balance | 50 | 5 | | 1.0 | | | 3 | | | | | | ○ | 11 | Good |
| Balance | 50 | 10 | | 1.5 | | | 5 | | | | | | ○ | 11 | Good |
| Balance | 50 | | 0.1 | | 1 | | | | | | | | ○ | 10 | Good |
| Balance | 50 | | 0.5 | | 2 | | | | | | | | ○ | 10 | Good |
| Balance | 50 | | 0.7 | | 5 | | | | | | | | ○ | 10 | Good |
| Balance | 50 | | 1.0 | | 7 | | | | | | | | ○ | 11 | Good |
| Balance | 50 | | 1.5 | | 10 | | | | | | | | ○ | 11 | Good |
| Balance | 50 | | 0.1 | | 1 | | 1 | | | | | | ○ | 10 | Good |
| Balance | 50 | | 0.5 | | 2 | | 2 | | | | | | ○ | 10 | Good |
| Balance | 50 | | 1.0 | | 5 | | 3 | | | | | | ○ | 11 | Good |
| Balance | 50 | | 1.5 | | 10 | | 5 | | | | | | ○ | 11 | Good |
| Balance | 50 | 1 | | | | | 0.05 | | | | | | ○ | 10 | Good |
| Balance | 50 | 3 | | | | | 0.1 | | | | | | ○ | 10 | Good |
| Balance | 50 | 5 | | | | | 1.0 | | | | | | ○ | 11 | Good |
| Balance | 50 | 10 | | | | | 3.0 | | | | | | ○ | 11 | Good |
| Balance | 50 | 1 | | | | | 0.05 | 1 | | | | | ○ | 10 | Good |
| Balance | 50 | 3 | | | | | 0.1 | 2 | | | | | ○ | 10 | Good |
| Balance | 50 | 5 | | | | | 1.0 | 3 | | | | | ○ | 11 | Good |
| Balance | 50 | 10 | | | | | 3.0 | 5 | | | | | ○ | 11 | Good |

TABLE 11

| Pb | Sn | In | Sb | Cu | Ni | Bi | Zn | Ag | Au | Pt | Pd | Others | Ball Formation | H$_B$ | Bonding Property |
|---|---|---|---|---|---|---|---|---|---|---|---|---|---|---|---|
| Balance | 50 | 1 | | 0.05 | | | | 0.1 | | | | | ○ | 10 | Good |
| Balance | 50 | 3 | | 0.1 | | | | 0.3 | | | | | ○ | 10 | Good |
| Balance | 50 | 5 | | 0.1 | | | | 0.5 | | | | | ○ | 11 | Good |
| Balance | 50 | 5 | | 0.5 | | | | 1.0 | | | | | ○ | 11 | Good |
| Balance | 50 | 7 | | 1.0 | | | | 1.5 | | | | | ○ | 11 | Good |
| Balance | 50 | 10 | | 1.5 | | | | 2.0 | | | | | ○ | 11 | Good |
| Balance | 50 | 1 | | 0.05 | | | | | 0.1 | | | | ○ | 10 | Good |
| Balance | 50 | 3 | | 0.1 | | | | | 0.3 | | | | ○ | 10 | Good |
| Balance | 50 | 5 | | 0.1 | | | | | 0.5 | | | | ○ | 11 | Good |
| Balance | 50 | 5 | | 0.5 | | | | | 1.0 | | | | ○ | 11 | Good |
| Balance | 50 | 7 | | 1.0 | | | | | 1.5 | | | | ○ | 11 | Good |
| Balance | 50 | 10 | | 1.5 | | | | | 2.0 | | | | ○ | 11 | Good |
| Balance | 50 | 1 | | 0.05 | | | | | | 0.1 | | | ○ | 10 | Good |
| Balance | 50 | 3 | | 0.1 | | | | | | 0.3 | | | ○ | 10 | Good |
| Balance | 50 | 5 | | 0.1 | | | | | | 0.5 | | | ○ | 11 | Good |
| Balance | 50 | 5 | | 0.5 | | | | | | 1.0 | | | ○ | 11 | Good |
| Balance | 50 | 7 | | 1.0 | | | | | | 1.5 | | | ○ | 11 | Good |

TABLE 11-continued

| Composition (% by wt.) | | | | | | | | | | | | | | |
|---|---|---|---|---|---|---|---|---|---|---|---|---|---|---|
| Pb | Sn | In | Sb | Cu | Ni | Bi | Zn | Ag | Au | Pt | Pd | Others | Ball Formation | $H_B$ | Bonding Property |
| Balance | 50 | 10 | 1.5 | | | | | | 2.0 | | | | ○ | 11 | Good |
| Balance | 50 | 1 | | 0.05 | | | 0.1 | | | | | | ○ | 10 | Good |
| Balance | 50 | 3 | | 0.1 | | | 0.3 | | | | | | ○ | 10 | Good |
| Balance | 50 | 5 | | 0.5 | | | 0.5 | | | | | | ○ | 11 | Good |
| Balance | 50 | 7 | | 1.0 | | | 1.5 | | | | | | ○ | 11 | Good |
| Balance | 50 | 10 | | 1.5 | | | 2.0 | | | | | | ○ | 11 | Good |
| Balance | 50 | 1 | | 0.05 | | | | | 0.1 | | | | ○ | 10 | Good |
| Balance | 50 | 3 | | 0.1 | | | | | 0.3 | | | | ○ | 10 | Good |
| Balance | 50 | 5 | | 0.5 | | | | | 0.5 | | | | ○ | 11 | Good |
| Balance | 50 | 7 | | 1.0 | | | | | 1.5 | | | | ○ | 11 | Good |
| Balance | 50 | 10 | | 1.5 | | | | | 2.0 | | | | ○ | 11 | Good |
| Balance | 50 | 1 | | 0.05 | | | | | | 0.1 | | | ○ | 10 | Good |
| Balance | 50 | 3 | | 0.1 | | | | | | 0.3 | | | ○ | 10 | Good |
| Balance | 50 | 5 | | 0.5 | | | | | | 0.5 | | | ○ | 11 | Good |
| Balance | 50 | 7 | | 1.0 | | | | | | 1.5 | | | ○ | 11 | Good |
| Balance | 50 | 10 | | 1.5 | | | | | | 2.0 | | | ○ | 11 | Good |

TABLE 12

| Composition (% by wt.) | | | | | | | | | | | | | | | |
|---|---|---|---|---|---|---|---|---|---|---|---|---|---|---|---|
| Pb | Sn | In | Sb | Cu | Ni | Bi | Zn | Ag | Au | Pt | Pd | Others | Ball Formation | $H_B$ | Bonding Property |
| 40 | Balance | | 1 | 0.1 | | | | | | | | | ○ | 10 | Good |
| 40 | Balance | | 3 | 0.5 | | | | | | | | | ○ | 10 | Good |
| 40 | Balance | | 5 | 1.0 | | | | | | | | | ○ | 11 | Good |
| 40 | Balance | | 10 | 1.5 | | | | | | | | | ○ | 12 | Good |
| 40 | Balance | | 1 | 0.1 | | | | 1 | | | | | ○ | 10 | Good |
| 40 | Balance | | 3 | 0.5 | | | | 2 | | | | | ○ | 10 | Good |
| 40 | Balance | | 5 | 1.0 | | | | 3 | | | | | ○ | 11 | Good |
| 40 | Balance | | 10 | 1.5 | | | | 5 | | | | | ○ | 12 | Good |
| 40 | Balance | | 1 | | 0.1 | | | | | | | | ○ | 10 | Good |
| 40 | Balance | | 3 | | 0.5 | | | | | | | | ○ | 10 | Good |
| 40 | Balance | | 5 | | 1.0 | | | | | | | | ○ | 11 | Good |
| 40 | Balance | | 10 | | 1.5 | | | | | | | | ○ | 12 | Good |
| 40 | Balance | | 1 | | 0.1 | | | 1 | | | | | ○ | 10 | Good |
| 40 | Balance | | 3 | | 0.5 | | | 2 | | | | | ○ | 10 | Good |
| 40 | Balance | | 5 | | 1.0 | | | 3 | | | | | ○ | 11 | Good |
| 40 | Balance | | 10 | | 1.5 | | | 5 | | | | | ○ | 12 | Good |
| 40 | Balance | | | 0.1 | 1 | | | | | | | | ○ | 10 | Good |
| 40 | Balance | | | 0.5 | 2 | | | | | | | | ○ | 10 | Good |
| 40 | Balance | | | 0.7 | 5 | | | | | | | | ○ | 11 | Good |
| 40 | Balance | | | 1.0 | 7 | | | | | | | | ○ | 11 | Good |
| 40 | Balance | | | 1.5 | 10 | | | | | | | | ○ | 12 | Good |
| 40 | Balance | | | 0.1 | 1 | | | 1 | | | | | ○ | 10 | Good |
| 40 | Balance | | | 0.5 | 2 | | | 2 | | | | | ○ | 10 | Good |
| 40 | Balance | | | 1.0 | 5 | | | 3 | | | | | ○ | 11 | Good |
| 40 | Balance | | | 1.5 | 10 | | | 5 | | | | | ○ | 12 | Good |
| 40 | Balance | | 1 | | | | 0.05 | | | | | | ○ | 10 | Good |
| 40 | Balance | | 3 | | | | 0.1 | | | | | | ○ | 10 | Good |
| 40 | Balance | | 5 | | | | 1.0 | | | | | | ○ | 11 | Good |
| 40 | Balance | | 10 | | | | 3.0 | | | | | | ○ | 12 | Good |
| 40 | Balance | | 1 | | | | 0.05 | 1 | | | | | ○ | 10 | Good |
| 40 | Balance | | 3 | | | | 0.1 | 2 | | | | | ○ | 10 | Good |
| 40 | Balance | | 5 | | | | 1.0 | 3 | | | | | ○ | 11 | Good |
| 40 | Balance | | 10 | | | | 3.0 | 5 | | | | | ○ | 12 | Good |

TABLE 13

| Composition (% by wt.) | | | | | | | | | | | | | | | |
|---|---|---|---|---|---|---|---|---|---|---|---|---|---|---|---|
| Pb | Sn | In | Sb | Cu | Ni | Bi | Zn | Ag | Au | Pt | Pd | Others | Ball Formation | $H_B$ | Bonding Property |
| 40 | Balance | | 1 | 0.05 | | | | 0.1 | | | | | ○ | 10 | Good |
| 40 | Balance | | 3 | 0.1 | | | | 0.3 | | | | | ○ | 10 | Good |
| 40 | Balance | | 5 | 0.1 | | | | 0.5 | | | | | ○ | 11 | Good |
| 40 | Balance | | 5 | 0.5 | | | | 1.0 | | | | | ○ | 11 | Good |
| 40 | Balance | | 7 | 1.0 | | | | 1.5 | | | | | ○ | 12 | Good |
| 40 | Balance | | 10 | 1.5 | | | | 2.0 | | | | | ○ | 12 | Good |
| 40 | Balance | | 1 | 0.05 | | | | | 0.1 | | | | ○ | 10 | Good |
| 40 | Balance | | 3 | 0.1 | | | | | 0.3 | | | | ○ | 10 | Good |
| 40 | Balance | | 5 | 0.1 | | | | | 0.5 | | | | ○ | 11 | Good |
| 40 | Balance | | 5 | 0.5 | | | | | 1.0 | | | | ○ | 11 | Good |
| 40 | Balance | | 7 | 1.0 | | | | | 1.5 | | | | ○ | 12 | Good |
| 40 | Balance | | 10 | 1.5 | | | | | 2.0 | | | | ○ | 12 | Good |
| 40 | Balance | | 1 | 0.05 | | | | | | 0.1 | | | ○ | 10 | Good |
| 40 | Balance | | 3 | 0.1 | | | | | | 0.3 | | | ○ | 10 | Good |
| 40 | Balance | | 5 | 0.1 | | | | | | 0.5 | | | ○ | 11 | Good |
| 40 | Balance | | 5 | 0.5 | | | | | | 1.0 | | | ○ | 11 | Good |
| 40 | Balance | | 7 | 1.0 | | | | | | 1.5 | | | ○ | 12 | Good |

TABLE 13-continued

| | | | | Composition (% by wt.) | | | | | | | | | Ball Formation | $H_B$ | Bonding Property |
|---|---|---|---|---|---|---|---|---|---|---|---|---|---|---|---|
| Pb | Sn | In | Sb | Cu | Ni | Bi | Zn | Ag | Au | Pt | Pd | Others | | | |
| 40 | Balance | | 10 | 1.5 | | | | | 2.0 | | | | ◯ | 12 | Good |
| 40 | Balance | | 1 | 0.05 | | | | 0.1 | | | | | ◯ | 10 | Good |
| 40 | Balance | | 3 | 0.1 | | | | 0.3 | | | | | ◯ | 10 | Good |
| 40 | Balance | | 5 | 0.5 | | | | 0.5 | | | | | ◯ | 11 | Good |
| 40 | Balance | | 7 | 1.0 | | | | 1.5 | | | | | ◯ | 12 | Good |
| 40 | Balance | | 10 | 1.5 | | | | 2.0 | | | | | ◯ | 12 | Good |
| 40 | Balance | | 1 | 0.05 | | | | | 0.1 | | | | ◯ | 10 | Good |
| 40 | Balance | | 3 | 0.1 | | | | | 0.3 | | | | ◯ | 10 | Good |
| 40 | Balance | | 5 | 0.5 | | | | | 0.5 | | | | ◯ | 11 | Good |
| 40 | Balance | | 7 | 1.0 | | | | | 1.5 | | | | ◯ | 12 | Good |
| 40 | Balance | | 10 | 1.5 | | | | | 2.0 | | | | ◯ | 12 | Good |
| 40 | Balance | | 1 | 0.05 | | | | | | 0.1 | | | ◯ | 10 | Good |
| 40 | Balance | | 3 | 0.1 | | | | | | 0.3 | | | ◯ | 10 | Good |
| 40 | Balance | | 5 | 0.5 | | | | | | 0.5 | | | ◯ | 11 | Good |
| 40 | Balance | | 7 | 1.0 | | | | | | 1.5 | | | ◯ | 12 | Good |
| 40 | Balance | | 10 | 1.5 | | | | | | 2.0 | | | ◯ | 12 | Good |

TABLE 14

| | | | | Composition (% by wt.) | | | | | | | | | Ball Formation | $H_B$ | Bonding Property |
|---|---|---|---|---|---|---|---|---|---|---|---|---|---|---|---|
| Pb | Sn | In | Sb | Cu | Ni | Bi | Zn | Ag | Au | Pt | Pd | Others | | | |
| Balance | 2 | | 0.1 | 0.01 | 0.01 | | | | | | | | ◯ | 5 | Bad |
| Balance | 2 | | 0.5 | 0.03 | 0.03 | | | | | | | | ◯ | 5 | Bad |
| Balance | 2 | | 0.5 | 0.05 | 0.05 | | | | | | | | ◯ | 6 | Good |
| Balance | 2 | | 0.5 | 0.07 | 0.03 | | | | | | | | ◯ | 6 | Good |
| Balance | 2 | | 0.5 | 0.03 | 0.07 | | | | | | | | ◯ | 6 | Good |
| Balance | 2 | | 1.0 | 0.5 | 0.5 | | | | | | | | ◯ | 7 | Good |
| Balance | 2 | | 0.5 | 0.01 | 0.01 | | | 0.01 | | | | | ◯ | 5 | Bad |
| Balance | 2 | | 0.5 | 0.03 | 0.03 | | | 0.05 | | | | | ◯ | 5 | Bad |
| Balance | 2 | | 0.5 | 0.05 | 0.05 | | | 0.1 | | | | | ◯ | 6 | Good |
| Balance | 2 | | 0.5 | 0.5 | 0.5 | | | 5.0 | | | | | ◯ | 7 | Good |
| Balance | 2 | | 0.5 | 0.01 | 0.01 | | | | 0.05 | | | | ◯ | 5 | Bad |
| Balance | 2 | | 0.5 | 0.05 | 0.05 | | | | 0.5 | | | | ◯ | 6 | Good |
| Balance | 2 | | 0.5 | 0.5 | 0.5 | | | | | 0.05 | | | ◯ | 7 | Good |
| Balance | 2 | | 0.5 | 0.01 | 0.01 | | | | | 0.5 | | | ◯ | 5 | Bad |
| Balance | 2 | | 0.5 | 0.05 | 0.05 | | | | | | 0.05 | | ◯ | 6 | Good |
| Balance | 2 | | 0.5 | 0.5 | 0.5 | | | | | | 0.5 | | ◯ | 7 | Good |
| Balance | 5 | | 0.1 | 0.01 | 0.01 | | | | | | | | ◯ | 5 | Bad |
| Balance | 5 | | 0.5 | 0.03 | 0.07 | | | | | | | | ◯ | 6 | Good |
| Balance | 5 | | 1.0 | 0.05 | 0.05 | | | | | | | | ◯ | 6 | Good |
| Balance | 5 | | 3.0 | 0.07 | 0.07 | | | | | | | | ◯ | 7 | Good |
| Balance | 5 | | 6.0 | 0.09 | 0.1 | | | | | | | | ◯ | 7 | Good |
| Balance | 5 | | 8.0 | 0.5 | 0.5 | | | | | | | | ◯ | 7 | Good |
| Balance | 5 | | 10.0 | 1.0 | 1.0 | | | | | | | | ◯ | 8 | Good |
| Balance | 5 | | 0.1 | 0.01 | 0.01 | | | 1.0 | | | | | ◯ | 6 | Good |
| Balance | 5 | | 1.0 | 0.1 | 0.1 | | | 5.0 | | | | | ◯ | 8 | Good |
| Balance | 5 | | 4.0 | 0.4 | 0.4 | | | 10.0 | | | | | ◯ | 9 | Good |
| Balance | 5 | | 10.0 | 1.0 | 1.0 | | | 30.0 | | | | | ◯ | 10 | Good |
| Balance | 5 | | | 0.01 | 0.01 | | | 0.1 | | | | | ◯ | 5 | Bad |
| Balance | 5 | | | 0.03 | 0.07 | | | 0.5 | | | | | ◯ | 6 | Good |
| Balance | 5 | | | 0.05 | 0.05 | | | 1.0 | | | | | ◯ | 6 | Good |
| Balance | 5 | | | 0.07 | 0.03 | | | 2.0 | | | | | ◯ | 6 | Good |
| Balance | 5 | | | 0.1 | 0.1 | | | 3.0 | | | | | ◯ | 7 | Good |
| Balance | 5 | | | 0.2 | 0.2 | | | 4.0 | | | | | ◯ | 7 | Good |

TABLE 15

| | | | | Composition (% by wt.) | | | | | | | | | Ball Formation | $H_B$ | Bonding Property |
|---|---|---|---|---|---|---|---|---|---|---|---|---|---|---|---|
| Pb | Sn | In | Sb | Cu | Ni | Bi | Zn | Ag | Au | Pt | Pd | Others | | | |
| Balance | 5 | | | 1.0 | 1.0 | | | 8.0 | | | | | ◯ | 8 | Good |
| Balance | 5 | | 0.1 | 0.01 | 0.01 | | | | 0.05 | | | | ◯ | 5 | Bad |
| Balance | 5 | | 1.0 | 0.05 | 0.05 | | | | 0.3 | | | | ◯ | 6 | Good |
| Balance | 5 | | 10.0 | 0.5 | 0.5 | | | | 0.5 | | | | ◯ | 7 | Good |
| Balance | 5 | | 0.1 | 0.01 | 0.01 | | | | 1.0 | | | | ◯ | 6 | Good |
| Balance | 5 | | 1.0 | 0.1 | 0.1 | | | | 5.0 | | | | ◯ | 8 | Good |
| Balance | 5 | | 4.0 | 0.4 | 0.4 | | | | 10.0 | | | | ◯ | 9 | Good |
| Balance | 5 | | 10.0 | 1.0 | 1.0 | | | | 30.0 | | | | ◯ | 10 | Good |
| Balance | 5 | | 0.1 | 0.01 | 0.01 | | | | | 1.0 | | | ◯ | 6 | Good |
| Balance | 5 | | 1.0 | 0.1 | 0.1 | | | | | 5.0 | | | ◯ | 8 | Good |
| Balance | 5 | | 4.0 | 0.4 | 0.4 | | | | | 10.0 | | | ◯ | 9 | Good |
| Balance | 5 | | 10.0 | 1.0 | 1.0 | | | | | 30.0 | | | ◯ | 10 | Good |
| Balance | 5 | | 0.1 | 0.01 | 0.01 | | | | | | 1.0 | | ◯ | 6 | Good |
| Balance | 5 | | 1.0 | 0.1 | 0.1 | | | | | | 5.0 | | ◯ | 8 | Good |
| Balance | 5 | | 4.0 | 0.4 | 0.4 | | | | | | 10.0 | | ◯ | 9 | Good |
| Balance | 5 | | 10.0 | 1.0 | 1.0 | | | | | | 30.0 | | ◯ | 10 | Good |
| Balance | 10 | | | 0.01 | 0.99 | | | 0.01 | | | | | ◯ | 9 | Good |

TABLE 15-continued

| Composition (% by wt.) | | | | | | | | | | | | | Ball Formation | $H_B$ | Bonding Property |
|---|---|---|---|---|---|---|---|---|---|---|---|---|---|---|---|
| Pb | Sn | In | Sb | Cu | Ni | Bi | Zn | Ag | Au | Pt | Pd | Others | | | |
| Balance | 10 | | | 0.05 | 0.10 | | | 0.1 | | | | | ○ | 6 | Good |
| Balance | 10 | | | 0.1 | 0.2 | | | 1.0 | | | | | ○ | 7 | Good |
| Balance | 10 | | | 0.2 | 0.2 | | | 2.0 | | | | | ○ | 7 | Good |
| Balance | 10 | | | 0.5 | 0.5 | | | 5.0 | | | | | ○ | 9 | Good |
| Balance | 10 | | | 0.99 | 0.01 | | | 8.0 | | | | | ○ | 9 | Good |
| Balance | 10 | | | 0.01 | 0.99 | | | | 0.01 | | | | ○ | 7 | Good |
| Balance | 10 | | | 0.09 | 0.10 | | | | 0.1 | | | | ○ | 8 | Good |
| Balance | 10 | | | 0.2 | 0.3 | | | | 0.3 | | | | ○ | 7 | Good |
| Balance | 10 | | | 0.99 | 0.01 | | | | 1.0 | | | | ○ | 8 | Good |
| Balance | 10 | | | 0.1 | 0.1 | | | | | 0.1 | | | ○ | 7 | Good |
| Balance | 10 | | | 0.5 | 0.5 | | | | | 1.0 | | | ○ | 8 | Good |
| Balance | 10 | | | 0.1 | 0.1 | | | | | | 0.1 | | ○ | 7 | Good |
| Balance | 10 | | | 0.5 | 0.5 | | | | | | 1.0 | | ○ | 8 | Good |
| Balance | 10 | | 0.1 | 0.01 | 0.01 | | | 1.0 | | | | | ○ | 7 | Good |
| Balance | 10 | | 1.0 | 0.2 | 0.2 | | | 5.0 | | | | | ○ | 8 | Good |
| Balance | 10 | | 1.0 | 0.4 | 0.4 | | | 10.0 | | | | | ○ | 8 | Good |

TABLE 16

| Composition (% by wt.) | | | | | | | | | | | | | Ball Formation | $H_B$ | Bonding Property |
|---|---|---|---|---|---|---|---|---|---|---|---|---|---|---|---|
| Pb | Sn | In | Sb | Cu | Ni | Bi | Zn | Ag | Au | Pt | Pd | Others | | | |
| Balance | 10 | | 4.0 | 0.4 | 0.4 | | | 10.0 | | | | | ○ | 9 | Good |
| Balance | 10 | | 10.0 | 1.0 | 1.0 | | | 30.0 | | | | | ○ | 10 | Good |
| Balance | 10 | | 0.1 | 0.01 | 0.01 | | | | 1.0 | | | | ○ | 7 | Good |
| Balance | 10 | | 1.0 | 0.2 | 0.2 | | | | 5.0 | | | | ○ | 8 | Good |
| Balance | 10 | | 1.0 | 0.4 | 0.4 | | | | 10.0 | | | | ○ | 8 | Good |
| Balance | 10 | | 4.0 | 0.4 | 0.4 | | | | 10.0 | | | | ○ | 9 | Good |
| Balance | 10 | | 10.0 | 1.0 | 1.0 | | | | 30.0 | | | | ○ | 10 | Good |
| Balance | 10 | | 0.1 | 0.01 | 0.01 | | | | | 1.0 | | | ○ | 7 | Good |
| Balance | 10 | | 1.0 | 0.2 | 0.2 | | | | | 5.0 | | | ○ | 8 | Good |
| Balance | 10 | | 1.0 | 0.4 | 0.4 | | | | | 10.0 | | | ○ | 8 | Good |
| Balance | 10 | | 4.0 | 0.4 | 0.4 | | | | | 10.0 | | | ○ | 9 | Good |
| Balance | 10 | | 10.0 | 1.0 | 1.0 | | | | | 30.0 | | | ○ | 10 | Good |
| Balance | 10 | | 0.1 | 0.01 | 0.01 | | | | | | 1.0 | | ○ | 7 | Good |
| Balance | 10 | | 1.0 | 0.2 | 0.2 | | | | | | 5.0 | | ○ | 8 | Good |
| Balance | 10 | | 1.0 | 0.4 | 0.4 | | | | | | 10.0 | | ○ | 8 | Good |
| Balance | 10 | | 4.0 | 0.4 | 0.4 | | | | | | 10.0 | | ○ | 9 | Good |
| Balance | 10 | | 10.0 | 1.0 | 1.0 | | | | | | 30.0 | | ○ | 10 | Good |
| Balance | 15 | | 0.1 | 0.01 | 0.01 | | | 1.0 | | | | | ○ | 8 | Good |
| Balance | 15 | | 1.0 | 0.2 | 0.2 | | | 5.0 | | | | | ○ | 9 | Good |
| Balance | 15 | | 1.0 | 0.4 | 0.4 | | | 10.0 | | | | | ○ | 9 | Good |
| Balance | 15 | | 4.0 | 0.4 | 0.4 | | | 10.0 | | | | | ○ | 10 | Good |
| Balance | 15 | | 10.0 | 1.0 | 1.0 | | | 30.0 | | | | | ○ | 11 | Good |
| Balance | 20 | | 0.1 | 0.01 | 0.01 | | | 1.0 | | | | | ○ | 8 | Good |
| Balance | 20 | | 1.0 | 0.2 | 0.2 | | | 5.0 | | | | | ○ | 9 | Good |
| Balance | 20 | | 1.0 | 0.4 | 0.4 | | | 10.0 | | | | | ○ | 9 | Good |
| Balance | 20 | | 4.0 | 0.4 | 0.4 | | | 10.0 | | | | | ○ | 11 | Good |
| Balance | 20 | | 10.0 | 1.0 | 1.0 | | | 30.0 | | | | | ○ | 12 | Good |
| Balance | 20 | | 0.1 | 0.01 | 0.01 | | | | 1.0 | | | | ○ | 8 | Good |
| Balance | 20 | | 1.0 | 0.2 | 0.2 | | | | 5.0 | | | | ○ | 9 | Good |
| Balance | 20 | | 1.0 | 0.4 | 0.4 | | | | 10.0 | | | | ○ | 9 | Good |
| Balance | 20 | | 4.0 | 0.4 | 0.4 | | | | 10.0 | | | | ○ | 11 | Good |
| Balance | 20 | | 10.0 | 1.0 | 1.0 | | | | 30.0 | | | | ○ | 12 | Good |
| Balance | 20 | | 0.1 | 0.01 | 0.01 | | | | | 1.0 | | | ○ | 8 | Good |

TABLE 17

| Composition (% by wt.) | | | | | | | | | | | | | Ball Formation | $H_B$ | Bonding Property |
|---|---|---|---|---|---|---|---|---|---|---|---|---|---|---|---|
| Pb | Sn | In | Sb | Cu | Ni | Bi | Zn | Ag | Au | Pt | Pd | Others | | | |
| Balance | 20 | | 1.0 | 0.2 | 0.2 | | | | | 5.0 | | | ○ | 9 | Good |
| Balance | 20 | | 1.0 | 0.4 | 0.4 | | | | | 10.0 | | | ○ | 9 | Good |
| Balance | 20 | | 4.0 | 0.4 | 0.4 | | | | | 10.0 | | | ○ | 11 | Good |
| Balance | 20 | | 10.0 | 1.0 | 1.0 | | | | | 30.0 | | | ○ | 12 | Good |
| Balance | 20 | | 0.1 | 0.01 | 0.01 | | | | | | 1.0 | | ○ | 8 | Good |
| Balance | 20 | | 1.0 | 0.2 | 0.2 | | | | | | 5.0 | | ○ | 9 | Good |
| Balance | 20 | | 1.0 | 0.4 | 0.4 | | | | | | 10.0 | | ○ | 9 | Good |
| Balance | 20 | | 4.0 | 0.4 | 0.4 | | | | | | 10.0 | | ○ | 11 | Good |
| Balance | 20 | | 10.0 | 1.0 | 1.0 | | | | | | 30.0 | | ○ | 12 | Good |
| Balance | 30 | | | 0.01 | 0.99 | | | 0.1 | | | | | ○ | 7 | Good |
| Balance | 30 | | | 0.1 | 0.2 | | | 0.5 | | | | | ○ | 7 | Good |
| Balance | 30 | | | 0.3 | 0.4 | | | 4.0 | | | | | ○ | 8 | Good |
| Balance | 30 | | | 0.4 | 0.5 | | | 4.0 | | | | | ○ | 9 | Good |
| Balance | 30 | | | 0.4 | 0.3 | | | 4.0 | | | | | ○ | 9 | Good |
| Balance | 30 | | | 0.5 | 0.4 | | | 4.0 | | | | | ○ | 9 | Good |
| Balance | 30 | | | 0.5 | 0.5 | | | 5.0 | | | | | ○ | 10 | Good |
| Balance | 30 | | | 0.9 | 0.9 | | | 10.0 | | | | | ○ | 11 | Good |

TABLE 17-continued

| | | | | Composition (% by wt.) | | | | | | | | | | |
|---|---|---|---|---|---|---|---|---|---|---|---|---|---|---|
| Pb | Sn | In | Sb | Cu | Ni | Bi | Zn | Ag | Au | Pt | Pd | Others | Ball Formation | H$_B$ | Bonding Property |
| Balance | 30 | | | 0.1 | 0.1 | | | | 0.01 | | | | ○ | 7 | Good |
| Balance | 30 | | | 0.2 | 0.3 | | | | 0.1 | | | | ○ | 7 | Good |
| Balance | 30 | | | 0.3 | 0.4 | | | | 0.3 | | | | ○ | 9 | Good |
| Balance | 30 | | | 0.8 | 0.8 | | | | 1.0 | | | | ○ | 10 | Good |
| Balance | 30 | | | 0.1 | 0.1 | | | | | 0.1 | | | ○ | 7 | Good |
| Balance | 30 | | | 0.5 | 0.5 | | | | | 1.0 | | | ○ | 9 | Good |
| Balance | 30 | | | 0.1 | 0.1 | | | | | | 0.1 | | ○ | 7 | Good |
| Balance | 30 | | | 0.5 | 0.5 | | | | | | 1.0 | | ○ | 9 | Good |
| Balance | 40 | | | 0.01 | 0.99 | | | 0.1 | | | | | ○ | 10 | Good |
| Balance | 40 | | | 0.1 | 0.7 | | | 0.5 | | | | | ○ | 10 | Good |
| Balance | 40 | | | 0.3 | 0.4 | | | 3.0 | | | | | ○ | 11 | Good |
| Balance | 40 | | | 0.4 | 0.5 | | | 4.0 | | | | | ○ | 11 | Good |
| Balance | 40 | | | 0.4 | 0.3 | | | 4.0 | | | | | ○ | 11 | Good |
| Balance | 40 | | | 0.5 | 0.3 | | | 4.0 | | | | | ○ | 11 | Good |
| Balance | 40 | | | 0.5 | 0.5 | | | 4.0 | | | | | ○ | 11 | Good |
| Balance | 40 | | | 0.6 | 0.5 | | | 5.0 | | | | | ○ | 11 | Good |

TABLE 18

| | | | | Composition (% by wt.) | | | | | | | | | | |
|---|---|---|---|---|---|---|---|---|---|---|---|---|---|---|
| Pb | Sn | In | Sb | Cu | Ni | Bi | Zn | Ag | Au | Pt | Pd | Others | Ball Formation | H$_B$ | Bonding Property |
| Balance | 40 | | | 0.6 | 0.3 | | | 7.0 | | | | | ○ | 11 | Good |
| Balance | 40 | | | 0.99 | 0.01 | | | 8.0 | | | | | ○ | 11 | Good |
| Balance | 40 | | 0.1 | 0.01 | 0.01 | | | 1.0 | | | | | ○ | 10 | Good |
| Balance | 40 | | 1.0 | 0.1 | 0.1 | | | 5.0 | | | | | ○ | 10 | Good |
| Balance | 40 | | 1.0 | 0.4 | 0.4 | | | 10.0 | | | | | ○ | 11 | Good |
| Balance | 40 | | 4.0 | 0.4 | 0.4 | | | 10.0 | | | | | ○ | 12 | Good |
| Balance | 40 | | 10.0 | 1.0 | 1.0 | | | 30.0 | | | | | ○ | 13 | Good |
| Balance | 60 | | 0.1 | 0.01 | 0.01 | | | 1.0 | | | | | ○ | 11 | Good |
| Balance | 60 | | 1.0 | 0.1 | 0.1 | | | 5.0 | | | | | ○ | 12 | Good |
| Balance | 60 | | 4.0 | 0.4 | 0.4 | | | 10.0 | | | | | ○ | 13 | Good |
| Balance | 60 | | 1.0 | 0.4 | 0.4 | | | 10.0 | | | | | ○ | 13 | Good |
| Balance | 60 | | 10.0 | 1.0 | 1.0 | | | 30.0 | | | | | ○ | 14 | Good |
| Balance | 60 | | 0.1 | 0.01 | 0.01 | | | | 1.0 | | | | ○ | 11 | Good |
| Balance | 60 | | 1.0 | 0.1 | 0.1 | | | | 5.0 | | | | ○ | 12 | Good |
| Balance | 60 | | 1.0 | 0.4 | 0.4 | | | | 10.0 | | | | ○ | 13 | Good |
| Balance | 60 | | 4.0 | 0.4 | 0.4 | | | | 10.0 | | | | ○ | 13 | Good |
| Balance | 60 | | 10.0 | 1.0 | 1.0 | | | | 30.0 | | | | ○ | 14 | Good |
| Balance | 60 | | 0.1 | 0.01 | 0.01 | | | | | 1.0 | | | ○ | 11 | Good |
| Balance | 60 | | 1.0 | 0.1 | 0.1 | | | | | 5.0 | | | ○ | 12 | Good |
| Balance | 60 | | 1.0 | 0.4 | 0.4 | | | | | 10.0 | | | ○ | 13 | Good |
| Balance | 60 | | 4.0 | 0.4 | 0.4 | | | | | 10.0 | | | ○ | 13 | Good |
| Balance | 60 | | 10.0 | 1.0 | 1.0 | | | | | 30.0 | | | ○ | 14 | Good |
| Balance | 60 | | 0.1 | 0.01 | 0.01 | | | | | | 1.0 | | ○ | 11 | Good |
| Balance | 60 | | 1.0 | 0.1 | 0.1 | | | | | | 5.0 | | ○ | 12 | Good |
| Balance | 60 | | 1.0 | 0.4 | 0.4 | | | | | | 10.0 | | ○ | 13 | Good |
| Balance | 60 | | 4.0 | 0.4 | 0.4 | | | | | | 10.0 | | ○ | 13 | Good |
| Balance | 60 | | 10.0 | 1.0 | 1.0 | | | | | | 30.0 | | ○ | 14 | Good |

TABLE 19

| | | | | Composition (% by wt.) | | | | | | | | | | |
|---|---|---|---|---|---|---|---|---|---|---|---|---|---|---|
| Pb | Sn | In | Sb | Cu | Ni | Bi | Zn | Ag | Au | Pt | Pd | P | Ball Formation | H$_B$ | Bonding Property |
| 40 | Balance | | | 0.1 | 0.1 | | | 4.0 | | | | | ○ | 10 | Good |
| 40 | Balance | | | 0.01 | 0.99 | | | 0.1 | | | | | ○ | 12 | Good |
| 40 | Balance | | | 0.1 | 0.8 | | | 0.5 | | | | | ○ | 12 | Good |
| 40 | Balance | | | 0.3 | 0.6 | | | 3.0 | | | | | ○ | 13 | Good |
| 40 | Balance | | | 0.4 | 0.5 | | | 4.0 | | | | | ○ | 13 | Good |
| 40 | Balance | | | 0.5 | 0.3 | | | 4.0 | | | | | ○ | 12 | Good |
| 40 | Balance | | | 0.5 | 0.6 | | | 4.0 | | | | | ○ | 13 | Good |
| 40 | Balance | | | 0.6 | 0.1 | | | 3.0 | | | | | ○ | 12 | Good |
| 40 | Balance | | | 0.6 | 0.4 | | | 4.0 | | | | | ○ | 12 | Good |
| 40 | Balance | | | 0.6 | 0.5 | | | 4.0 | | | | | ○ | 13 | Good |
| 40 | Balance | | | 0.6 | 0.7 | | | 7.0 | | | | | ○ | 13 | Good |
| 40 | Balance | | | 0.7 | 0.1 | | | 8.0 | | | | | ○ | 12 | Good |
| 40 | Balance | | | 0.99 | 0.01 | | | 10.0 | | | | | ○ | 12 | Good |
| | Balance | | | | 1.0 | | | | | | | | ○ | 12 | Good |
| | Balance | | | 0.1 | 0.9 | | | 4.0 | | | | | ○ | 14 | Good |
| | Balance | | | 0.4 | 0.6 | | | 10.0 | | | | | ○ | 14 | Good |
| | Balance | | | 0.5 | 0.5 | | | | | | | | ○ | 13 | Good |
| | Balance | | | 0.7 | 0.3 | | | | | | | | ○ | 13 | Good |
| | Balance | | | 1.0 | | | | | | | | | ○ | 12 | Good |
| | Balance | | | 2.0 | | | | | | | | | ○ | 12 | Good |
| | Balance | | | | 2.0 | | | | | | | | ○ | 12 | Good |
| | Balance | | | | | | | 0.01 | | | | | ○ | 10 | Good |
| | Balance | | | | | | | 0.1 | | | | | ○ | 10 | Good |

TABLE 19-continued

| Pb | Sn | In | Sb | Cu | Ni | Bi | Zn | Ag | Au | Pt | Pd | P | Ball Formation | $H_B$ | Bonding Property |
|---|---|---|---|---|---|---|---|---|---|---|---|---|---|---|---|
|  | Balance |  |  |  |  |  |  | 1.0 |  |  |  |  | ○ | 12 | Good |
|  | Balance |  |  |  |  |  |  | 5.0 |  |  |  |  | ○ | 12 | Good |
|  | Balance |  |  |  |  |  |  | 10.0 |  |  |  |  | ○ | 13 | Good |
|  | Balance |  |  |  |  |  |  | 20.0 |  |  |  |  | ○ | 15 | Good |
|  | Balance |  |  |  |  |  |  |  | 0.01 |  |  |  | ○ | 10 | Good |
|  | Balance |  |  |  |  |  |  |  | 0.1 |  |  |  | ○ | 10 | Good |
|  | Balance |  |  |  |  |  |  |  | 1.0 |  |  |  | ○ | 12 | Good |
|  | Balance |  |  |  |  |  |  |  | 5.0 |  |  |  | ○ | 12 | Good |
|  | Balance |  |  |  |  |  |  |  | 10.0 |  |  |  | ○ | 13 | Good |
|  | Balance |  |  |  |  |  |  |  | 20.0 |  |  |  | ○ | 15 | Good |

TABLE 20

| Pb | Sn | In | Sb | Cu | Ni | Bi | Zn | Ag | Au | Pt | Pd | P | Ball Formation | $H_B$ | Bonding Property |
|---|---|---|---|---|---|---|---|---|---|---|---|---|---|---|---|
|  | Balance |  |  |  |  |  |  |  |  | 0.01 |  |  | ○ | 10 | Good |
|  | Balance |  |  |  |  |  |  |  |  | 0.1 |  |  | ○ | 10 | Good |
|  | Balance |  |  |  |  |  |  |  |  | 1.0 |  |  | ○ | 12 | Good |
|  | Balance |  |  |  |  |  |  |  |  | 5.0 |  |  | ○ | 12 | Good |
|  | Balance |  |  |  |  |  |  |  |  | 10.0 |  |  | ○ | 13 | Good |
|  | Balance |  |  |  |  |  |  |  |  | 20.0 |  |  | ○ | 15 | Good |
|  | Balance |  |  |  |  |  |  |  |  |  | 0.01 |  | ○ | 10 | Good |
|  | Balance |  |  |  |  |  |  |  |  |  | 0.1 |  | ○ | 10 | Good |
|  | Balance |  |  |  |  |  |  |  |  |  | 1.0 |  | ○ | 12 | Good |
|  | Balance |  |  |  |  |  |  |  |  |  | 5.0 |  | ○ | 12 | Good |
|  | Balance |  |  |  |  |  |  |  |  |  | 10.0 |  | ○ | 13 | Good |
|  | Balance |  |  |  |  |  |  |  |  |  | 20.0 |  | ○ | 15 | Good |
|  | Balance |  | 0.01 |  |  |  |  | 0.01 |  |  |  |  | ○ | 11 | Good |
|  | Balance |  | 0.1 |  |  |  |  | 0.1 |  |  |  |  | ○ | 11 | Good |
|  | Balance |  | 0.1 |  |  |  |  | 1.0 |  |  |  |  | ○ | 12 | Good |
|  | Balance |  | 1.0 |  |  |  |  | 3.0 |  |  |  |  | ○ | 13 | Good |
|  | Balance |  | 2.0 |  |  |  |  | 5.0 |  |  |  |  | ○ | 14 | Good |
|  | Balance |  | 3.0 |  |  |  |  | 5.0 |  |  |  |  | ○ | 15 | Good |
|  | Balance |  | 4.0 |  |  |  |  | 5.0 |  |  |  |  | ○ | 16 | Good |
|  | Balance |  | 5.0 |  |  |  |  | 7.0 |  |  |  |  | ○ | 16 | Good |
|  | Balance |  | 5.0 |  |  |  |  | 10.0 |  |  |  |  | ○ | 17 | Good |
|  | Balance |  | 10.0 |  |  |  |  | 20.0 |  |  |  |  | ○ | 20 | Good |
|  | Balance |  | 0.01 |  |  |  |  |  | 0.01 |  |  |  | ○ | 11 | Good |
|  | Balance |  | 0.1 |  |  |  |  |  | 0.1 |  |  |  | ○ | 11 | Good |
|  | Balance |  | 1.0 |  |  |  |  |  | 1.0 |  |  |  | ○ | 12 | Good |
|  | Balance |  | 3.0 |  |  |  |  |  | 5.0 |  |  |  | ○ | 14 | Good |
|  | Balance |  | 5.0 |  |  |  |  |  | 10.0 |  |  |  | ○ | 17 | Good |
|  | Balance |  | 10.0 |  |  |  |  |  | 20.0 |  |  |  | ○ | 20 | Good |
|  | Balance |  | 0.01 |  |  |  |  |  |  | 0.01 |  |  | ○ | 11 | Good |
|  | Balance |  | 0.1 |  |  |  |  |  |  | 0.1 |  |  | ○ | 11 | Good |
|  | Balance |  | 1.0 |  |  |  |  |  |  | 1.0 |  |  | ○ | 12 | Good |
|  | Balance |  | 3.0 |  |  |  |  |  |  | 5.0 |  |  | ○ | 14 | Good |
|  | Balance |  | 5.0 |  |  |  |  |  |  | 10.0 |  |  | ○ | 17 | Good |

TABLE 21

| Pb | Sn | In | Sb | Cu | Ni | Bi | Zn | Ag | Au | Pt | Pd | P | Ball Formation | $H_B$ | Bonding Property |
|---|---|---|---|---|---|---|---|---|---|---|---|---|---|---|---|
|  | Balance |  | 10.0 |  |  |  |  |  |  |  | 20.0 |  | ○ | 20 | Good |
|  | Balance |  | 0.01 |  |  |  |  |  |  |  | 0.01 |  | ○ | 11 | Good |
|  | Balance |  | 0.1 |  |  |  |  |  |  |  | 0.1 |  | ○ | 11 | Good |
|  | Balance |  | 1.0 |  |  |  |  |  |  |  | 1.0 |  | ○ | 12 | Good |
|  | Balance |  | 3.0 |  |  |  |  |  |  |  | 5.0 |  | ○ | 13 | Good |
|  | Balance |  | 5.0 |  |  |  |  |  |  |  | 10.0 |  | ○ | 17 | Good |
|  | Balance |  | 10.0 |  |  |  |  |  |  |  | 20.0 |  | ○ | 20 | Good |
|  | Balance |  |  |  |  |  | 0.01 | 0.01 |  |  |  |  | ○ | 10 | Good |
|  | Balance |  |  |  |  |  | 0.1 | 0.1 |  |  |  |  | ○ | 10 | Good |
|  | Balance |  |  |  |  |  | 0.5 | 1.0 |  |  |  |  | ○ | 12 | Good |
|  | Balance |  |  |  |  |  | 0.5 | 5.0 |  |  |  |  | ○ | 12 | Good |
|  | Balance |  |  |  |  |  | 1.0 | 5.0 |  |  |  |  | ○ | 13 | Good |
|  | Balance |  |  |  |  |  | 3.0 | 5.0 |  |  |  |  | ○ | 13 | Good |
|  | Balance |  |  |  |  |  | 7.0 | 10.0 |  |  |  |  | ○ | 16 | Good |
|  | Balance |  |  |  |  |  | 10.0 | 20.0 |  |  |  |  | ○ | 20 | Good |
|  | Balance |  |  |  |  |  | 0.01 | 0.01 |  |  |  | 0.0001 | ○ | 10 | Good |
|  | Balance |  |  |  |  |  | 0.1 | 1.0 |  |  |  | 0.005 | ○ | 11 | Good |
|  | Balance |  |  |  |  |  | 0.2 | 5.0 |  |  |  | 0.025 | ○ | 12 | Good |
|  | Balance |  |  |  |  |  | 3.0 | 10.0 |  |  |  | 0.1 | ○ | 14 | Good |
|  | Balance |  |  |  |  |  | 0.01 |  | 0.01 |  |  |  | ○ | 10 | Good |
|  | Balance |  |  |  |  |  | 1.0 |  | 1.0 |  |  |  | ○ | 12 | Good |
|  | Balance |  |  |  |  |  | 3.0 |  | 5.0 |  |  |  | ○ | 13 | Good |
|  | Balance |  |  |  |  |  | 10.0 |  | 20.0 |  |  |  | ○ | 20 | Good |

TABLE 21-continued

| Pb | Sn | In | Sb | Cu | Ni | Bi | Zn | Ag | Au | Pt | Pd | P | Ball Formation | $H_B$ | Bonding Property |
|---|---|---|---|---|---|---|---|---|---|---|---|---|---|---|---|
| | Balance | | | | | | 0.01 | 0.01 | | | | 0.0001 | ○ | 10 | Good |
| | Balance | | | | | | 0.1 | 1.0 | | | | 0.005 | ○ | 11 | Good |
| | Balance | | | | | | 0.2 | 5.0 | | | | 0.025 | ○ | 12 | Good |
| | Balance | | | | | | 3.0 | 10.0 | | | | 0.1 | ○ | 14 | Good |
| | Balance | | | | | | 0.01 | | 0.01 | | | | ○ | 10 | Good |
| | Balance | | | | | | 1.0 | | 1.0 | | | | ○ | 12 | Good |
| | Balance | | | | | | 3.0 | | 5.0 | | | | ○ | 13 | Good |
| | Balance | | | | | | 10.0 | | 20.0 | | | | ○ | 20 | Good |
| | Balance | | | | | | 0.01 | | 0.01 | | | 0.0001 | ○ | 10 | Good |
| | Balance | | | | | | 0.1 | | 1.0 | | | 0.005 | ○ | 11 | Good |

TABLE 22

| Pb | Sn | In | Sb | Cu | Ni | Bi | Zn | Ag | Au | Pt | Pd | P | Ball Formation | $H_B$ | Bonding Property |
|---|---|---|---|---|---|---|---|---|---|---|---|---|---|---|---|
| | Balance | | | | | | 0.2 | | 5.0 | | | 0.025 | ○ | 12 | Good |
| | Balance | | | | | | 3.0 | | 10.0 | | | 0.1 | ○ | 14 | Good |
| | Balance | | | | | | 0.01 | | | 0.01 | | | ○ | 10 | Good |
| | Balance | | | | | | 1.0 | | | 1.0 | | | ○ | 12 | Good |
| | Balance | | | | | | 3.0 | | | 5.0 | | | ○ | 13 | Good |
| | Balance | | | | | | 10.0 | | | 20.0 | | | ○ | 20 | Good |
| | Balance | | | | | | 0.01 | | | 0.01 | | 0.0001 | ○ | 10 | Good |
| | Balance | | | | | | 0.1 | | | 1.0 | | 0.005 | ○ | 11 | Good |
| | Balance | | | | | | 0.2 | | | 5.0 | | 0.025 | ○ | 12 | Good |
| | Balance | | | | | | 3.0 | | | 10.0 | | 0.1 | ○ | 14 | Good |
| | Balance | | 0.01 | 0.01 | | | | 0.01 | | | | | ○ | 11 | Good |
| | Balance | | 0.1 | 0.1 | | | | 0.1 | | | | | ○ | 11 | Good |
| | Balance | | 0.1 | 0.1 | | | | 1.0 | | | | | ○ | 12 | Good |
| | Balance | | 1.0 | 0.5 | | | | 3.0 | | | | | ○ | 13 | Good |
| | Balance | | 2.0 | 0.7 | | | | 5.0 | | | | | ○ | 14 | Good |
| | Balance | | 3.0 | 1.0 | | | | 5.0 | | | | | ○ | 15 | Good |
| | Balance | | 4.0 | 1.0 | | | | 5.0 | | | | | ○ | 16 | Good |
| | Balance | | 5.0 | 1.0 | | | | 7.0 | | | | | ○ | 17 | Good |
| | Balance | | 5.0 | 1.0 | | | | 10.0 | | | | | ○ | 18 | Good |
| | Balance | | 10.0 | 2.0 | | | | 20.0 | | | | | ○ | 24 | Good |
| | Balance | | 0.01 | 0.01 | | | | | 0.01 | | | | ○ | 11 | Good |
| | Balance | | 0.1 | 0.1 | | | | | 0.1 | | | | ○ | 11 | Good |
| | Balance | | 1.0 | 0.5 | | | | | 1.0 | | | | ○ | 12 | Good |
| | Balance | | 3.0 | 1.0 | | | | | 5.0 | | | | ○ | 14 | Good |
| | Balance | | 5.0 | 1.5 | | | | | 10.0 | | | | ○ | 18 | Good |
| | Balance | | 10.0 | 2.0 | | | | | 20.0 | | | | ○ | 24 | Good |
| | Balance | | 0.01 | 0.01 | | | | | | 0.01 | | | ○ | 11 | Good |
| | Balance | | 0.1 | 0.1 | | | | | | 0.1 | | | ○ | 11 | Good |
| | Balance | | 1.0 | 0.5 | | | | | | 1.0 | | | ○ | 12 | Good |
| | Balance | | 3.0 | 1.0 | | | | | | 5.0 | | | ○ | 14 | Good |
| | Balance | | 5.0 | 1.5 | | | | | | 10.0 | | | ○ | 18 | Good |
| | Balance | | 10.0 | 2.0 | | | | | | 20.0 | | | ○ | 24 | Good |
| | Balance | | 0.01 | 0.01 | | | | | | | 0.01 | | ○ | 11 | Good |

TABLE 23

| Pb | Sn | In | Sb | Cu | Ni | Bi | Zn | Ag | Au | Pt | Pd | P | Ball Formation | $H_B$ | Bonding Property |
|---|---|---|---|---|---|---|---|---|---|---|---|---|---|---|---|
| | Balance | | 0.1 | 0.1 | | | | | | | 0.1 | | ○ | 11 | Good |
| | Balance | | 1.0 | 0.5 | | | | | | | 1.0 | | ○ | 12 | Good |
| | Balance | | 3.0 | 1.0 | | | | | | | 5.0 | | ○ | 14 | Good |
| | Balance | | 5.0 | 1.5 | | | | | | | 10.0 | | ○ | 18 | Good |
| | Balance | | 10.0 | 2.0 | | | | | | | 20.0 | | ○ | 24 | Good |
| | Balance | | 0.01 | | 0.01 | | | 0.01 | | | | | ○ | 11 | Good |
| | Balance | | 0.1 | | 0.1 | | | 0.1 | | | | | ○ | 11 | Good |
| | Balance | | 0.1 | | 0.1 | | | 1.0 | | | | | ○ | 12 | Good |
| | Balance | | 1.0 | | 0.5 | | | 3.0 | | | | | ○ | 13 | Good |
| | Balance | | 2.0 | | 0.7 | | | 5.0 | | | | | ○ | 14 | Good |
| | Balance | | 3.0 | | 1.0 | | | 5.0 | | | | | ○ | 15 | Good |
| | Balance | | 4.0 | | 1.0 | | | 5.0 | | | | | ○ | 16 | Good |
| | Balance | | 5.0 | | 1.0 | | | 7.0 | | | | | ○ | 17 | Good |
| | Balance | | 5.0 | | 1.0 | | | 10.0 | | | | | ○ | 18 | Good |
| | Balance | | 10.0 | | 2.0 | | | 20.0 | | | | | ○ | 24 | Good |
| | Balance | | 0.01 | | 0.01 | | | | 0.01 | | | | ○ | 11 | Good |
| | Balance | | 0.1 | | 0.1 | | | | 0.1 | | | | ○ | 11 | Good |
| | Balance | | 0.1 | | 0.1 | | | | 1.0 | | | | ○ | 12 | Good |
| | Balance | | 1.0 | | 0.5 | | | | 3.0 | | | | ○ | 13 | Good |
| | Balance | | 2.0 | | 0.7 | | | | 5.0 | | | | ○ | 14 | Good |
| | Balance | | 3.0 | | 1.0 | | | | 5.0 | | | | ○ | 15 | Good |
| | Balance | | 4.0 | | 1.0 | | | | 5.0 | | | | ○ | 16 | Good |
| | Balance | | 5.0 | | 1.0 | | | | 7.0 | | | | ○ | 17 | Good |

TABLE 23-continued

| Pb | Sn | In | Sb | Cu | Ni | Bi | Zn | Ag | Au | Pt | Pd | P | Ball Formation | $H_B$ | Bonding Property |
|----|----|----|----|----|----|----|----|----|----|----|----|---|----------------|-------|------------------|
| | Balance | | 5.0 | 1.0 | | | | | 10.0 | | | | ○ | 18 | Good |
| | Balance | | 10.0 | 2.0 | | | | | 20.0 | | | | ○ | 24 | Good |
| | Balance | | 0.01 | 0.01 | | | | | | 0.01 | | | ○ | 11 | Good |
| | Balance | | 0.1 | 0.1 | | | | | | 0.1 | | | ○ | 11 | Good |
| | Balance | | 0.1 | 0.1 | | | | | | 1.0 | | | ○ | 12 | Good |
| | Balance | | 1.0 | 0.5 | | | | | | 3.0 | | | ○ | 13 | Good |
| | Balance | | 2.0 | 0.7 | | | | | | 5.0 | | | ○ | 14 | Good |
| | Balance | | 3.0 | 1.0 | | | | | | 5.0 | | | ○ | 15 | Good |
| | Balance | | 4.0 | 1.0 | | | | | | 5.0 | | | ○ | 16 | Good |
| | Balance | | 5.0 | 1.0 | | | | | | 7.0 | | | ○ | 17 | Good |

TABLE 24

| Pb | Sn | In | Sb | Cu | Ni | Bi | Zn | Ag | Au | Pt | Pd | P | Ball Formation | $H_B$ | Bonding Property |
|----|----|----|----|----|----|----|----|----|----|----|----|---|----------------|-------|------------------|
| | Balance | | 5.0 | 1.0 | | | | | | 10.0 | | | ○ | 18 | Good |
| | Balance | | 10.0 | 2.0 | | | | | | 20.0 | | | ○ | 24 | Good |
| | Balance | | 0.01 | 0.01 | | | | | | | 0.01 | | ○ | 11 | Good |
| | Balance | | 0.1 | 0.1 | | | | | | | 0.1 | | ○ | 11 | Good |
| | Balance | | 0.1 | 0.1 | | | | | | | 1.0 | | ○ | 12 | Good |
| | Balance | | 1.0 | 0.5 | | | | | | | 3.0 | | ○ | 13 | Good |
| | Balance | | 2.0 | 0.7 | | | | | | | 5.0 | | ○ | 14 | Good |
| | Balance | | 3.0 | 1.0 | | | | | | | 5.0 | | ○ | 15 | Good |
| | Balance | | 4.0 | 1.0 | | | | | | | 5.0 | | ○ | 16 | Good |
| | Balance | | 5.0 | 1.0 | | | | | | | 7.0 | | ○ | 17 | Good |
| | Balance | | 5.0 | 1.0 | | | | | | | 10.0 | | ○ | 18 | Good |
| | Balance | | 10.0 | 2.0 | | | | | | | 20.0 | | ○ | 22 | Good |
| | Balance | | 0.01 | | | | 0.01 | 0.01 | | | | | ○ | 11 | Good |
| | Balance | | 0.1 | | | | 0.1 | 0.1 | | | | | ○ | 11 | Good |
| | Balance | | 0.5 | | | | 0.5 | 1.0 | | | | | ○ | 12 | Good |
| | Balance | | 0.5 | | | | 0.5 | 5.0 | | | | | ○ | 13 | Good |
| | Balance | | 1.0 | | | | 1.0 | 5.0 | | | | | ○ | 14 | Good |
| | Balance | | 1.0 | | | | 3.0 | 5.0 | | | | | ○ | 15 | Good |
| | Balance | | 5.0 | | | | 7.0 | 10.0 | | | | | ○ | 19 | Good |
| | Balance | | 10.0 | | | | 10.0 | 20.0 | | | | | ○ | 26 | Good |
| | Balance | | 0.01 | | | | 0.01 | 0.01 | | | | 0.0001 | ○ | 11 | Good |
| | Balance | | 0.5 | | | | 0.1 | 1.0 | | | | 0.005 | ○ | 12 | Good |
| | Balance | | 1.0 | | | | 0.2 | 5.0 | | | | 0.025 | ○ | 13 | Good |
| | Balance | | 5.0 | | | | 3.0 | 10.0 | | | | 0.1 | ○ | 18 | Good |
| | Balance | | 0.01 | | | | 0.01 | | 0.01 | | | | ○ | 11 | Good |
| | Balance | | 0.5 | | | | 1.0 | | 1.0 | | | | ○ | 12 | Good |
| | Balance | | 5.0 | | | | 3.0 | | 5.0 | | | | ○ | 17 | Good |
| | Balance | | 10.0 | | | | 10.0 | | 20.0 | | | | ○ | 26 | Good |
| | Balance | | 0.01 | | | | 0.01 | | 0.01 | | | 0.0001 | ○ | 11 | Good |
| | Balance | | 0.5 | | | | 0.1 | | 1.0 | | | 0.005 | ○ | 12 | Good |
| | Balance | | 1.0 | | | | 0.2 | | 5.0 | | | 0.025 | ○ | 13 | Good |
| | Balance | | 5.0 | | | | 3.0 | | 10.0 | | | 0.1 | ○ | 18 | Good |
| | Balance | | 0.01 | | | | 0.01 | | | 0.01 | | | ○ | 11 | Good |

TABLE 25

| Pb | Sn | In | Sb | Cu | Ni | Bi | Zn | Ag | Au | Pt | Pd | P | Ball Formation | $H_B$ | Bonding Property |
|----|----|----|----|----|----|----|----|----|----|----|----|---|----------------|-------|------------------|
| | Balance | | 0.5 | | | | 1.0 | | | 1.0 | | | ○ | 12 | Good |
| | Balance | | 5.0 | | | | 3.0 | | | 5.0 | | | ○ | 17 | Good |
| | Balance | | 10.0 | | | | 10.0 | | | 20.0 | | | ○ | 26 | Good |
| | Balance | | 0.01 | | | | 0.01 | | | 0.01 | | 0.0001 | ○ | 11 | Good |
| | Balance | | 0.5 | | | | 0.1 | | | 1.0 | | 0.005 | ○ | 12 | Good |
| | Balance | | 1.0 | | | | 0.2 | | | 5.0 | | 0.025 | ○ | 13 | Good |
| | Balance | | 5.0 | | | | 3.0 | | | 10.0 | | 0.1 | ○ | 18 | Good |
| | Balance | | 0.01 | | | | 0.01 | | | | 0.01 | | ○ | 11 | Good |
| | Balance | | 0.5 | | | | 1.0 | | | | 1.0 | | ○ | 12 | Good |
| | Balance | | 5.0 | | | | 3.0 | | | | 5.0 | | ○ | 17 | Good |
| | Balance | | 10.0 | | | | 10.0 | | | | 20.0 | | ○ | 26 | Good |
| | Balance | | 0.01 | | | | 0.01 | | | | 0.01 | 0.0001 | ○ | 11 | Good |
| | Balance | | 0.5 | | | | 0.1 | | | | 1.0 | 0.005 | ○ | 12 | Good |
| | Balance | | 1.0 | | | | 0.2 | | | | 5.0 | 0.025 | ○ | 13 | Good |
| | Balance | | 5.0 | | | | 3.0 | | | | 10.0 | 0.1 | ○ | 18 | Good |
| | Balance | | | 0.01 | | | 0.01 | 0.01 | | | | | ○ | 11 | Good |
| | Balance | | | 0.5 | | | 1.0 | 1.0 | | | | | ○ | 12 | Good |
| | Balance | | | 1.0 | | | 1.0 | 5.0 | | | | | ○ | 14 | Good |
| | Balance | | | 2.0 | | | 10.0 | 20.0 | | | | | ○ | 24 | Good |
| | Balance | | | 0.01 | | | 0.01 | | 0.01 | | | | ○ | 11 | Good |
| | Balance | | | 0.5 | | | 1.0 | | 1.0 | | | | ○ | 12 | Good |
| | Balance | | | 2.0 | | | 10.0 | | 20.0 | | | | ○ | 24 | Good |
| | Balance | | | 0.01 | | | 0.01 | | | 0.01 | | | ○ | 11 | Good |

TABLE 25-continued

| Pb | Sn | In | Sb | Cu | Ni | Bi | Zn | Ag | Au | Pt | Pd | P | Ball Formation | $H_B$ | Bonding Property |
|---|---|---|---|---|---|---|---|---|---|---|---|---|---|---|---|
| | Balance | | | 0.5 | | | 1.0 | | 1.0 | | | | O | 12 | Good |
| | Balance | | | 2.0 | | | 10.0 | | 20.0 | | | | O | 24 | Good |
| | Balance | | | 0.01 | | | 0.01 | | | | 0.01 | | O | 11 | Good |
| | Balance | | | 0.5 | | | 1.0 | | | | 1.0 | | O | 12 | Good |
| | Balance | | | 2.0 | | | 10.0 | | | | 20.0 | | O | 24 | Good |
| | Balance | | | | 0.01 | | 0.01 | 0.01 | | | | | O | 11 | Good |
| | Balance | | | | 0.5 | | 1.0 | 1.0 | | | | | O | 12 | Good |
| | Balance | | | | 1.0 | | 1.0 | 5.0 | | | | | O | 14 | Good |
| | Balance | | | | 2.0 | | 10.0 | 20.0 | | | | | O | 24 | Good |
| | Balance | | | | 0.01 | | 0.01 | | 0.01 | | | | O | 11 | Good |

TABLE 26

| Pb | Sn | In | Sb | Cu | Ni | Bi | Zn | Ag | Au | Pt | Pd | P | Ball Formation | $H_B$ | Bonding Property |
|---|---|---|---|---|---|---|---|---|---|---|---|---|---|---|---|
| | Balance | | | 0.5 | | | 1.0 | | 1.0 | | | | O | 12 | Good |
| | Balance | | | 2.0 | | | 10.0 | | 20.0 | | | | O | 24 | Good |
| | Balance | | | 0.01 | | | 0.01 | | | | 0.01 | | O | 11 | Good |
| | Balance | | | 0.5 | | | 1.0 | | | | 1.0 | | O | 12 | Good |
| | Balance | | | 2.0 | | | 10.0 | | | | 20.0 | | O | 24 | Good |
| | Balance | | | | 0.01 | | 0.01 | | | | 0.01 | | O | 11 | Good |
| | Balance | | | | 0.5 | | 1.0 | | | | 1.0 | | O | 12 | Good |
| | Balance | | | | 2.0 | | 10.0 | | | | 20.0 | | O | 24 | Good |
| | Balance | | 0.01 | 0.01 | | | 0.01 | 0.01 | | | | | O | 11 | Good |
| | Balance | | 1.0 | 0.5 | | | 1.0 | 1.0 | | | | | O | 13 | Good |
| | Balance | | 5.0 | 1.0 | | | 1.0 | 5.0 | | | | | O | 15 | Good |
| | Balance | | 10.0 | 2.0 | | | 10.0 | 20.0 | | | | | O | 26 | Good |
| | Balance | | 0.01 | 0.01 | | | 0.01 | | 0.01 | | | | O | 11 | Good |
| | Balance | | 1.0 | 0.5 | | | 1.0 | | 1.0 | | | | O | 13 | Good |
| | Balance | | 10.0 | 2.0 | | | 10.0 | | 10.0 | | | | O | 26 | Good |
| | Balance | | 0.01 | 0.01 | | | 0.01 | | | 0.01 | | | O | 11 | Good |
| | Balance | | 1.0 | 0.5 | | | 1.0 | | | 1.0 | | | O | 13 | Good |
| | Balance | | 10.0 | 2.0 | | | 10.0 | | | 10.0 | | | O | 26 | Good |
| | Balance | | 0.01 | 0.01 | | | 0.01 | | | | 0.01 | | O | 11 | Good |
| | Balance | | 1.0 | 0.5 | | | 1.0 | | | | 1.0 | | O | 13 | Good |
| | Balance | | 10.0 | 2.0 | | | 10.0 | | | | 10.0 | | O | 26 | Good |
| | Balance | | 0.01 | | 0.01 | | 0.01 | 0.01 | | | | | O | 11 | Good |
| | Balance | | 1.0 | | 0.5 | | 1.0 | 1.0 | | | | | O | 13 | Good |
| | Balance | | 5.0 | | 1.0 | | 1.0 | 5.0 | | | | | O | 15 | Good |
| | Balance | | 10.0 | | 2.0 | | 10.0 | 20.0 | | | | | O | 26 | Good |
| | Balance | | 0.01 | | 0.01 | | 0.01 | | 0.01 | | | | O | 11 | Good |
| | Balance | | 1.0 | | 0.5 | | 1.0 | | 1.0 | | | | O | 13 | Good |
| | Balance | | 10.0 | | 2.0 | | 10.0 | | 10.0 | | | | O | 26 | Good |
| | Balance | | 0.01 | | 0.01 | | 0.01 | | | 0.01 | | | O | 11 | Good |
| | Balance | | 1.0 | | 0.5 | | 1.0 | | | 1.0 | | | O | 13 | Good |
| | Balance | | 10.0 | | 2.0 | | 10.0 | | | 10.0 | | | O | 26 | Good |
| | Balance | | 0.01 | | 0.01 | | 0.01 | | | | 0.01 | | O | 11 | Good |
| | Balance | | 1.0 | | 0.5 | | 1.0 | | | | 1.0 | | O | 13 | Good |

TABLE 27

| Pb | Sn | In | Sb | Cu | Ni | Bi | Zn | Ag | Au | Pt | Pd | P | Ball Formation | $H_B$ | Bonding Property |
|---|---|---|---|---|---|---|---|---|---|---|---|---|---|---|---|
| | Balance | | 10.0 | 2.0 | | | 10.0 | | | | 10.0 | | O | 26 | Good |

What is claimed is:

1. A connecting material for a semiconductor having aluminum alloy wiring line, comprising a ball having a Brinell hardness which is greater than 6, said ball having been formed by heating the tip of an alloy wire, the alloy wire produced by drawing a rapidly-quenched alloy, said alloy comprising:
   a principal element selected from the group consisting of Pb and Sn;
   0.01–10 wt % Sb; and
   0.01–10 wt % Zn, having an intermetallic compound formed between Sb and the aluminum alloy wiring line, and said Zn occluded into the aluminum alloy wiring line.

2. A connecting material according to claim 1, wherein said alloy further contains at least one element selected from the group consisting of Cu, Ni, Ag, Pt, Pd and P.

3. A connecting material according to claim 1, wherein the Brinell hardness number of said ball is in the range of $H_B$ 6 to $H_B$ 26.

4. A connecting material for a semi-conductor material comprising a ball having a Brinell hardness which is greater than 6, said ball comprising a bump contact on an upper surface of an aluminum alloy wiring line formed by heating the tip of a fine alloy wire, said fine alloy wire produced from an alloy by a rapid quenching method, said alloy wire comprising a principal element selected from the group consisting of Pb and Sn;
   0.01–10 wt. % Sb, which produces Sb-Al intermetallic compounds with said aluminum alloy wiring line; and 0.01–10 wt. % Zn, which diffuses into said aluminum alloy wiring line.

5. A connecting material according to claim 4, wherein said alloy forming said fine alloy wire contains at least one element selected from the group consisting of Cu, Ni, Ag, Pt, Pd and P.

6. A connecting material according to claim 4, wherein the Brinell hardness number of said ball is in the range of $H_B$ 6 to $H_B$ 26.

* * * * *

UNITED STATES PATENT AND TRADEMARK OFFICE
CERTIFICATE OF CORRECTION

PATENT NO. : 5,366,692
DATED : November 22, 1994
INVENTOR(S) : Toshinori OGASHIWA It is certified that error appears in the above-indentified patent and that said Letters Patent is hereby corrected as shown below:

At column 1, line 23, change "Pb" to ---Pb,---.

At column 2, line 68, change "It," to ---Ir,---.

At column 3, line 38, after "substrate" insert ---1,---.

At column 4, line 2, after "chip" insert ---2,---.

In Table 14, column "Ag", line 10, change "5.0" to ---4.0---.

In Table 18, column "Sb", line 10, change "4.0" to ---1.0---.

In Table 18, column "Sb", line 11, change "1.0" to ---4.0---.

In Table 20, column "P", line 8, move "◯" to column "Ball Formation", line 7.

Signed and Sealed this

Twenty-fourth Day of December, 1996

Attest:

BRUCE LEHMAN

*Attesting Officer*    *Commissioner of Patents and Trademarks*